United States Patent
Banna et al.

(10) Patent No.: US 10,271,416 B2
(45) Date of Patent: Apr. 23, 2019

(54) HIGH EFFICIENCY TRIPLE-COIL INDUCTIVELY COUPLED PLASMA SOURCE WITH PHASE CONTROL

(71) Applicant: APPLIED MATERIALS, INC., Santa Clara, CA (US)

(72) Inventors: Samer Banna, San Jose, CA (US); Waheb Bishara, Menlo Park, CA (US); Ryan Giar, San Jose, CA (US); Valentin Todorow, Palo Alto, CA (US); Dmitry Lubomirsky, Cupertino, CA (US); Kyle R. Tantiwong, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1315 days.

(21) Appl. No.: 13/657,232

(22) Filed: Oct. 22, 2012

(65) Prior Publication Data

US 2013/0105086 A1    May 2, 2013

Related U.S. Application Data

(60) Provisional application No. 61/552,623, filed on Oct. 28, 2011, provisional application No. 61/676,559, filed on Jul. 27, 2012.

(51) Int. Cl.
    *H05H 1/46* (2006.01)
(52) U.S. Cl.
    CPC ....... *H05H 1/46* (2013.01); *H05H 2001/4667* (2013.01)
(58) Field of Classification Search
    CPC .................. H05H 1/46; H05H 2001/4667
    See application file for complete search history.

(56) References Cited

U.S. PATENT DOCUMENTS

| 5,683,548 A | 11/1997 | Hartig et al. |
| 6,806,437 B2 | 10/2004 | Oh |
| 7,700,465 B2 | 4/2010 | Collins et al. |

(Continued)

FOREIGN PATENT DOCUMENTS

JP        2011096690 A    *    5/2011

OTHER PUBLICATIONS

International Search Report and Written Opinion dated Mar. 29, 2013 for PCT Application No. PCT/US2012/061410.
U.S. Appl. No. 13/650,835, filed Oct. 12, 2012, Banna et al.

*Primary Examiner* — Yuechuan Yu
(74) *Attorney, Agent, or Firm* — Moser Taboada; Alan Taboada

(57) ABSTRACT

A plasma processing apparatus may include a process chamber having an interior processing volume, first, second and third RF coils disposed proximate the process chamber to couple RF energy into the processing volume, wherein the second RF coil disposed coaxially with respect to the first RF coil, and wherein the third RF coil disposed coaxially with respect to the first and second RF coils, at least one ferrite shield disposed proximate to at least one of the first, second or third RF coils, wherein the ferrite shield is configured to locally guide a magnetic field produced by an RF current flow through the first, second or third RF coils toward the process chamber, wherein the plasma processing apparatus is configured to control a phase of each RF current flow through each of the of the first, second or third RF coils.

14 Claims, 13 Drawing Sheets

(56) References Cited

U.S. PATENT DOCUMENTS

| | | |
|---|---|---|
| 7,952,048 B2 | 5/2011 | Choi et al. |
| 8,264,154 B2 | 9/2012 | Banner et al. |
| 8,933,628 B2 | 1/2015 | Banna et al. |
| 9,082,590 B2 | 7/2015 | Carducci et al. |
| 9,082,591 B2 | 7/2015 | Dorf et al. |
| 9,111,722 B2 | 8/2015 | Dorf et al. |
| 9,161,428 B2 | 10/2015 | Collins et al. |
| 2004/0083971 A1* | 5/2004 | Holland ............... H01J 37/321 118/721 |
| 2004/0223579 A1 | 11/2004 | Lee et al. |
| 2007/0256784 A1* | 11/2007 | Chandrachood ...... H01J 37/321 156/345.24 |
| 2007/0266947 A1 | 11/2007 | Onoda et al. |
| 2008/0017317 A1 | 1/2008 | Jeon et al. |
| 2009/0284156 A1 | 11/2009 | Banna et al. |
| 2010/0269980 A1* | 10/2010 | Nishimura ............ H01J 37/321 156/345.48 |
| 2011/0059615 A1 | 3/2011 | Marakhtanov et al. |
| 2011/0094683 A1 | 4/2011 | Chen et al. |
| 2011/0094994 A1* | 4/2011 | Todorow ............... H01J 37/321 216/68 |
| 2011/0097901 A1 | 4/2011 | Banna et al. |
| 2011/0115378 A1* | 5/2011 | Lubomirsky ........ H01J 37/3211 315/111.21 |
| 2011/0278260 A1* | 11/2011 | Lai .................... C23C 16/45565 216/68 |
| 2012/0035766 A1* | 2/2012 | Shajii .................... H01J 37/321 700/274 |
| 2013/0105086 A1 | 5/2013 | Banna et al. |
| 2013/0256271 A1 | 10/2013 | Panagopoulos et al. |
| 2014/0020835 A1 | 1/2014 | Nguyen et al. |
| 2014/0020836 A1 | 1/2014 | Nguyen et al. |
| 2014/0020837 A1 | 1/2014 | Nguyen et al. |
| 2014/0020838 A1 | 1/2014 | Kenney et al. |
| 2014/0020839 A1 | 1/2014 | Kenney et al. |
| 2014/0232263 A1 | 8/2014 | Nguyen et al. |
| 2014/0265832 A1 | 9/2014 | Kenney et al. |
| 2014/0312766 A1 | 10/2014 | Carducci et al. |

\* cited by examiner

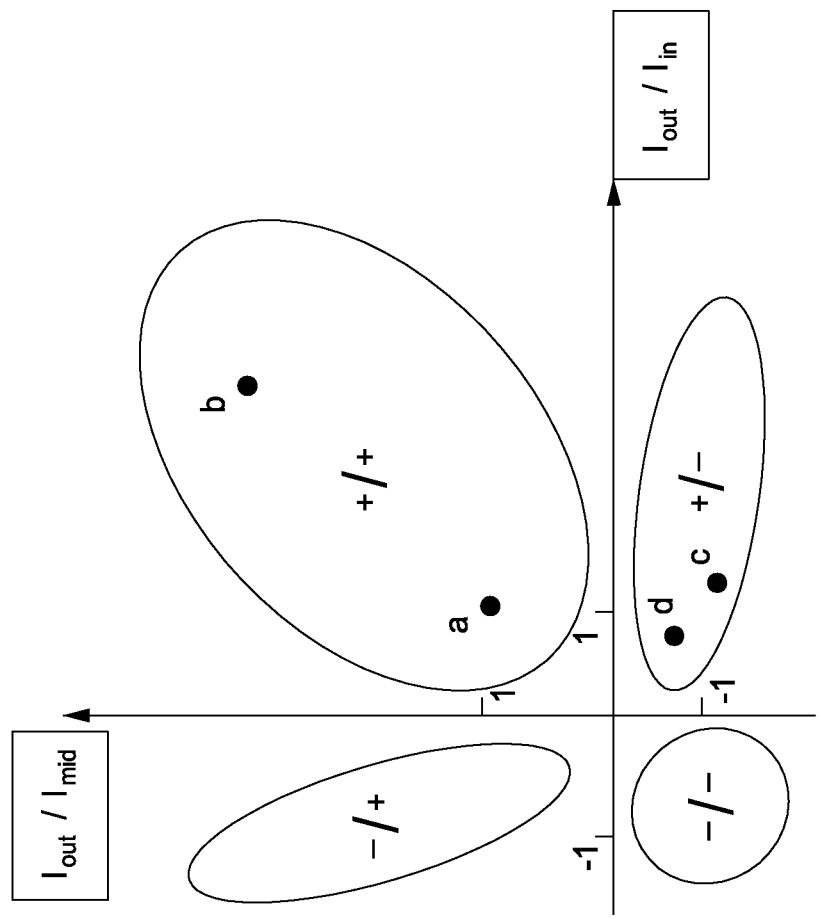

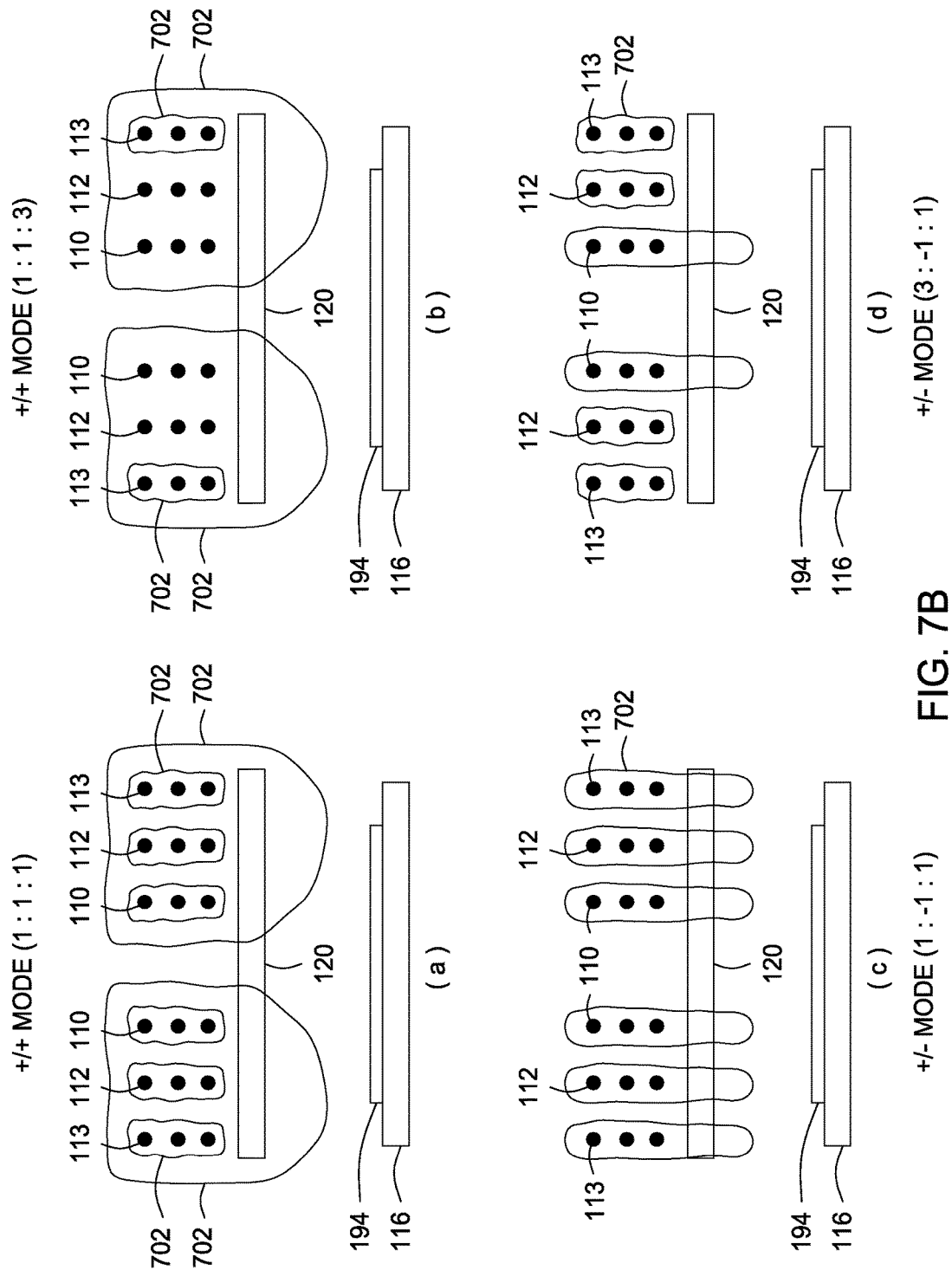

HIGH EFFICIENCY TRIPLE-COIL INDUCTIVELY COUPLED PLASMA SOURCE WITH PHASE CONTROL

CROSS-REFERENCE TO RELATED APPLICATIONS

This application claims benefit of U.S. provisional patent application Ser. No. 61/552,623, filed Oct. 28, 2011, and U.S. provisional patent application Ser. No. 61/676,559, filed Jul. 27, 2012, each of which are herein incorporated by reference.

FIELD

Embodiments of the present invention generally relate to plasma processing equipment.

BACKGROUND

Inductively coupled plasma (ICP) process reactors generally form plasmas by inducing current in a process gas disposed within the process chamber via one or more inductive coils disposed outside of the process chamber. The inductive coils may be disposed externally and separated electrically from the chamber by, for example, a dielectric lid. When radio frequency (RF) current is fed to the inductive coils via an RF feed structure from an RF power source, an inductively coupled plasma can be formed inside the chamber from an electric field generated by the inductive coils.

In some reactor designs, the reactor may be configured to have concentric inner and outer inductive coils. The inventors have discovered that additive electric field properties (due to destructive interference of the magnetic fields induced by the coils) between the inner and outer coils can result in non-uniformities in the electric field distribution of the plasma formed at the substrate level away from the coils. For example, due to etch rate non-uniformities caused by the non-uniform electric field distribution in the plasma, a substrate etched by such a plasma may result in a non-uniform etch pattern on the substrate, such as an M-shaped etch pattern, e.g., a center low and edge low etch surface with peaks between the center and edge. The inventor's have further observed that adjusting the power ratio between the inner and outer coils to control the severity of the non-uniformity is not sufficient to completely eliminate the non-uniformity. Moreover, the inventors believe that in order to meet the critical dimension requirements of advanced device nodes, e.g., about 32 nm and below, the remaining etch pattern non-uniformities due to this phenomenon may need to be further reduced or eliminated.

The inventors have further discovered, for example, that the properties of an inductive plasma apparatus, such as one having inner and outer inductive coils as discussed above may not scale linearly as the diameters of the inner and outer inductive coils are linearly increased. For example, the inventors have discovered that if the diameters of the inner and outer coils are linearly increased, for example, for use in a reactor configured for 450 mm diameter substrates, the center-to-edge tunability of the process to reduce or eliminate the M-shape etch pattern or other processing non-uniformities, is not sufficient to meet the critical dimension requirements of advanced device nodes.

Accordingly, the inventors have devised a plasma process apparatus to better control plasma processing non-uniformity.

SUMMARY

Methods and apparatus for plasma processing are provided herein. In some embodiments, a plasma processing apparatus may include a process chamber having an interior processing volume, a first RF coil disposed proximate the process chamber to couple RF energy into the processing volume; a second RF coil disposed proximate the process chamber to couple RF energy into the processing volume, the second RF coil disposed coaxially with respect to the first RF coil, a third RF coil disposed proximate the process chamber to couple RF energy into the processing volume, the third RF coil disposed coaxially with respect to the first and second RF coils, and at least one ferrite shield disposed proximate to at least one of the first, second or third RF coils, wherein the ferrite shield is configured to locally confine/direct a magnetic field produced by an RF current flow through the first, second or third RF coils toward the process chamber, wherein the plasma processing apparatus is configured such that, when RF current flows through the each of the RF coils, either the RF current flows out-of-phase through at least one of the first, second or third RF coils with respect to at least another of the first, second or third RF coils, or the phase of the RF current may be selectively controlled to be in-phase or out-of-phase in at least one of the first, second or third RF coils with respect to at least another of the first, second or third RF coils.

In some embodiments, a plasma processing apparatus may include a process chamber having an interior processing volume; a first RF coil disposed proximate the process chamber to couple RF energy into the processing volume; a second RF coil disposed proximate the process chamber to couple RF energy into the processing volume, the second RF coil disposed coaxially with respect to the first RF coil; and a third RF coil disposed proximate the process chamber to couple RF energy into the processing volume, the third RF coil disposed coaxially with respect to the first and second RF coils, a coil controller to control movement of the first, second and third RF coils to a desired position, wherein the first, second and third RF coils are configured to move in at least one of vertical, horizontal and rotational directions, and wherein the plasma processing apparatus is configured such that, when RF current flows through each of the RF coils, either the RF current flows out-of-phase through at least one of the first, second or third RF coils with respect to at least another of the first, second or third RF coils, or the phase of the RF current may be selectively controlled to be in-phase or out-of-phase in at least one of the first, second or third RF coils with respect to at least another of the first, second or third RF coils.

In some embodiments, a method of plasma processing in a process chamber includes providing a first RF signal through a first RF coil; providing a second RF signal through a second RF coil coaxially disposed with respect to the first RF coil; providing a third RF signal through a third RF coil coaxially disposed with respect to the first and second RF coils, wherein either the first RF signal flows out-of-phase with respect to at least one of the second or third RF signals, or the phase of the first RF signal with respect to at least one of the second or third RF signals may be selectively controlled to be in-phase or out-of-phase; and moving at least one of (a) at least one ferrite shield to cover at least a portion of at least one of the first, second or third RF coils to locally confine a magnetic field produced by an RF current flow through the first, second or third RF coils toward the process chamber or (b) the first, second and third RF coils to control an intensity the magnetic field produced by an RF current flow through the first, second or third RF coils.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

FIGS. 7A-B illustratively depicts different RF current phase combinations and their associated azimuthal electromagnetic field distributions using embodiments of the inventive apparatus as disclosed herein.

Figure 1:
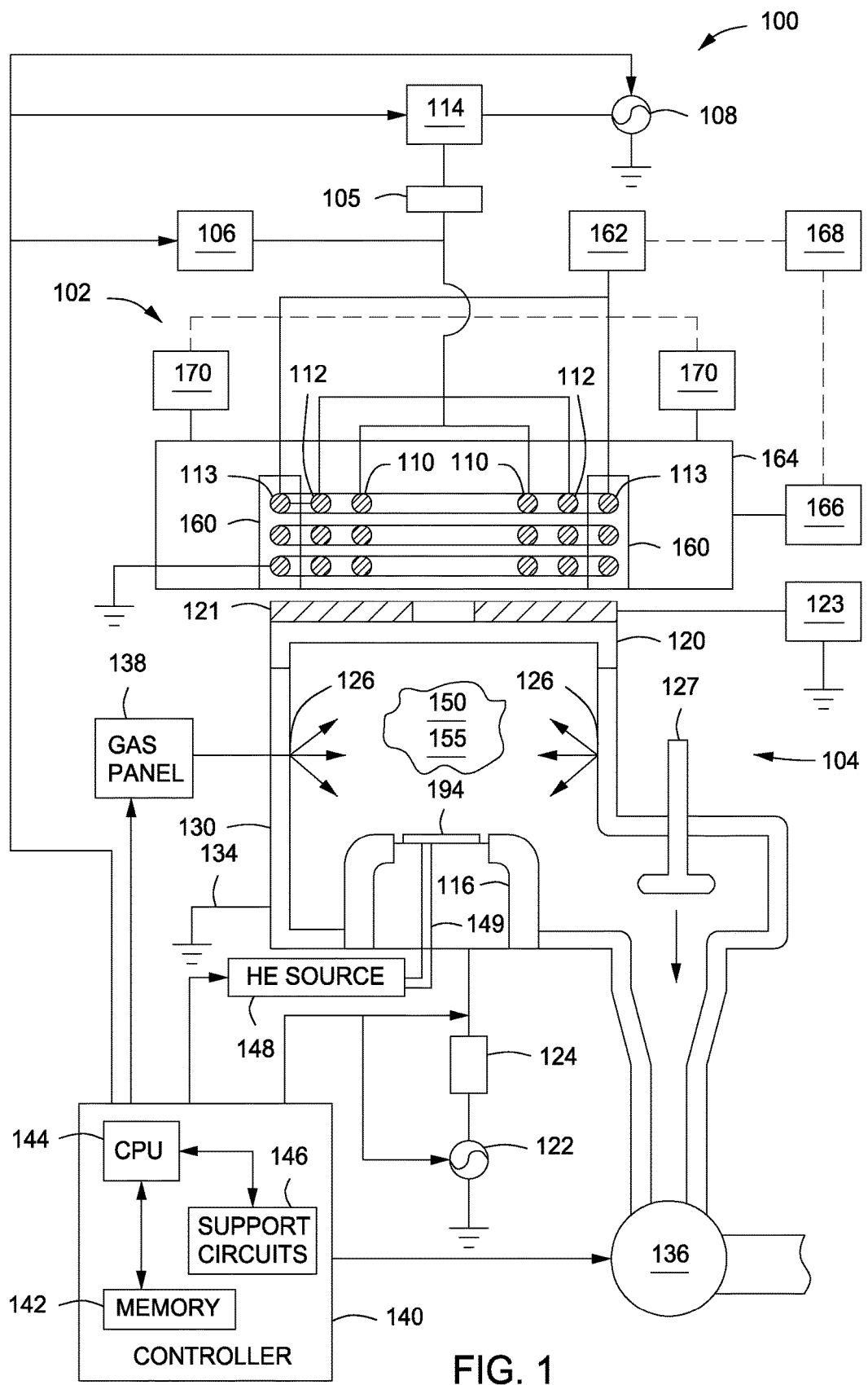
FIG. 1 depicts a schematic side view of an inductively coupled plasma reactor in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for plasma processing are provided herein. The inventive methods and plasma processing apparatus may advantageously provide a more uniform plasma as compared to conventional apparatus. In addition, the inventive methods and plasma processing apparatus may advantageously provide a more uniform plasma as compared to conventional apparatus when scaled to accommodate larger diameter substrates, e.g., 450 mm, thus providing a more uniform processing result on a substrate being processed with the plasma. For example, a plasma formed utilizing the inventive plasma apparatus has an improved electric field distribution, which provides a more uniform plasma and can be utilized to produce a more uniform process, such as an etch pattern on a surface of a substrate. Embodiments consistent with the present invention accomplish this by advantageously using three coils with current phase control, wherein some or all of the coils may be fully or partially shielded with ferrite shielding to increase the confinement of the magnetic field lines, thereby increasing power coupling efficiency and allowing control of the localized power coupling within the plasma apparatus. Moreover, having the ferrite shielding movable (up and down) provides the ability to control the power coupling between the coils, and therefore, shapes the electro-magnetic (EM) field lines under the dielectric window, which provides flexible control of the plasma profile created within the plasma apparatus. In addition, having the ferrite shielding movable (rotationally) provides the ability to control the EM field lines under the dielectric window, which provides further flexible control of the plasma profile created within the plasma apparatus. Furthermore, by providing movable coils such that the coils may be moved horizontally, vertically and/or tilted on axis, the intensity of the EM field lines may be controlled to greater degree, hence controlling plasma density created within the plasma apparatus.

FIG. 1 depicts a schematic side view of an inductively coupled plasma reactor (reactor 100) in accordance with some embodiments of the present invention. The reactor 100 may be utilized alone or, as a processing module of an integrated semiconductor substrate processing system, or cluster tool, such as a CENTURA® integrated semiconductor wafer processing system, available from Applied Materials, Inc. of Santa Clara, Calif. Examples of suitable plasma reactors that may advantageously benefit from modification in accordance with embodiments of the present invention include inductively coupled plasma etch reactors such as the DPS® line of semiconductor equipment (such as the DPS®, DPS® II, DPS® AE, DPS® G3 poly etcher, DPS® G5, or the like) also available from Applied Materials, Inc. The above listing of semiconductor equipment is illustrative only, and other etch reactors, and non-etch equipment (such as CVD reactors, or other semiconductor processing equipment) may also be suitably modified in accordance with the present teachings. Although described herein in connection with larger diameter substrates, such as 450 mm diameter substrates, the reactor 100 is not limited to thereto. For example, embodiments of the inventive methods and apparatus may be beneficial toward improved etch rate profiles on substrates in reactors designed for larger or smaller substrates, such as 200 or 300 mm diameters substrates, or the like.

The reactor 100 includes an inductively coupled plasma apparatus 102 disposed atop a process chamber 104. The inductively coupled plasma apparatus may include a plurality of RF coils, e.g., a first RF coil 110, a second RF coil 112, and a third RF coil 113 coupled to an RF power source 108. The plurality of RF coils may be coupled to the RF power source 108 via an RF feed structure (not shown). Further details regarding an exemplary RF feed structure that may be used with one or more embodiments of the present invention may be found in U.S. patent application Ser. No. 12/821,626, filed on Jun. 23, 2010, by Z. Chen, et al., and entitled "RF FEED STRUCTURE FOR PLASMA PROCESSING". The plurality of RF coils are coaxially disposed proximate the process chamber 104 (for example, above the process chamber) and are configured to inductively couple RF power into the process chamber 104 to form a plasma from process gases provided within the process chamber 104. For example, as illustrated in FIG. 1, the first RF coil 110 may be the innermost coil. The second RF coil 112 may be concentrically disposed about the first RF coil 110. The third RF coil 113 may be concentrically disposed about the second RF coil 112.

The spacing between adjacent RF coils may be selected, for example, to control interference between electromagnetic fields generated by RF current flowing through adjacent RF coils. For example, the interference between electromagnetic fields may be critical to controlling center to edge uniformity on a substrate. For example, in some embodiments, the first RF coil 110 may have a first diameter of about 5 inches. In some embodiments, the second RF coil 112 may have a second diameter of about 13 inches. In some embodiments, the third RF coil 113 may have a third diameter of about 17 inches. However, the first, second and third diameters are not limited to the dimensions listed above, and any suitable dimensions that result in the desired center to edge uniformity on the substrate may be utilized.

In some embodiments, the inductively coupled plasma apparatus 102 may include one or more ferrite shields 160 that are configured to locally confine a magnetic field produced by an RF current flow through the first, second or third RF coils toward the process chamber. Properly placed ferrite shields advantageously guide the magnetic fields into the plasma. By locally confining a magnetic field produced by an RF current flow through the first, second or third RF coils toward the process chamber, the coupling efficiency between the source coils 110, 112 and 113 and the plasma is thereby increased. Higher coupling efficiency between the source coils 110, 112 and 113 to the plasma leads to higher plasma density. In addition, the higher efficiency, due to magnetic shielding by ferrite shields 160, is particularly useful in a reverse operation mode (i.e., where the current between two adjacent coils are out of phase) where the destructive interference of EM fields lowers the inductive coupling efficiency to plasma.

In some embodiments, the ferrite shields 160 can be adjustable to move (e.g., up and down) and cover single or multiple turns of a given coil allowing flexibility in controlling EM fields coupling between the coils. (See FIG. 8 and associated described below for further details.) Switching RF current phase, along with ferrite shield 160 position optimization advantageously minimizes the M-shape signature of typical ICP reactors. The one or more ferrite shields 160 may be moved via ferrite shield actuator 162. The movement of the one or more ferrite shields 160 may be controlled by a controller 168 communicatively coupled to ferrite shield actuator 162.

In addition the ferrite shield may be a fixed wire coupled to one or more turns of one or more of the first, second and/or third RF coils. (See FIG. 9 and associated described below for further details.) One or more of the three coils can be shielded with the ferrite shield 160. In some embodiments, the upper part of each coil turn may be separately shielded.

The ferrite shields 160 are formed from materials having a high magnetic permeability such as, but not limited to, Ni—Zn, for example. The relative magnetic permeability ($\mu/\mu_0$) of the ferrite shields 160 may be between about 10 $\mu/\mu_0$ and 10,000 $\mu/\mu_0$, although other materials having different relative magnetic permeability may also be used depending on the operating frequency of the RF current flows required. In some embodiments, the ferrite material can vary from coil to coil to allow flexibility in field distribution control. In some embodiments, the type of ferrite material used is selected based on the temperature dependency of resistivity and permeability of the ferrites.

In some embodiments where ferrite shields 160 are used, the coils 110, 112, and 113 and ferrite shields 160 can be water cooled to ensure heat dissipation while operating at high powers leading to extensive heat.

In some embodiments, the first, second, and third RF coils 110, 112, and 113 are movable in at least one of vertical, horizontal and rotational directions. In some embodiments, the first, second, and third RF coils 110, 112, and 113 are configured to rotate about a horizontal axis (i.e., tilted) such that a first portion of the first, second, and third RF coils 110, 112, and 113 is disposed closer to the process chamber 104, and a second portion of the first, second, and third RF coils 110, 112, and 113 is disposed further from the process chamber 104. The movement of the coils 110, 112 and 113 closer to the process chamber 104, or further away from the process chamber 104 changes the intensity of the magnetic field produced by an RF current flow through the first, second or third RF coils 110, 112, and 113.

In some embodiments, the coils 110, 112, and 113 (collectively referred to as a coil assembly 164) may be moved horizontally via one or more coil actuators 166 and vertically via one or more coil actuators 170. In some embodiments, the coils 110, 112, and 113 may be tilted by moving one or more coil actuators 170 in different directions or by different amounts. For example, in some embodiments, one actuator 170 move one side of coils 110, 112, and 113 closer to process chamber 104, and another actuator 170 move an opposite side of coils 110, 112, and 113 further from process chamber 104. Other methods of tilting coils 110, 112, and 113 may also be used. The movement of the coils 110, 112, and 113 may be controlled by a controller 168 communicatively coupled coil actuators 166 and 170. In some embodiments, the controller 168 or separate controllers (not shown) may be used to control the movement of the one or more ferrite shields 160 and coils 110, 112, and 113.

As illustrated in FIG. 1, the RF power source 108 may be coupled to the first, second, and third RF coils 110, 112, 113 via a match network 114. The RF power source may be a single RF power source as illustrated in FIG. 1 to provide RF power to each of the first, second, and third RF coils 110, 112, 113. A power divider 105 may be provided to adjust the RF power respectively delivered to two or more of the first, second, and third RF coils 110, 112, 113. For example, as illustrated in FIG. 1, the RF power source 108 may be coupled through the power divider 105 to each of the first, second, and third RF coils 110, 112, 113. The power divider 105 may be coupled between the match network 114 and the plurality of RF coils, or an RF feed structure when an RF feed structure is present. Alternatively, the power divider may be a part of the match network 114, in which case the match network will have three outputs coupled to the plurality of RF coils or the RF feed structure—one corresponding to each RF coil 110, 112, 113. The power divider is discussed in more detail below. The match network circuit and coil circuit are discussed in more detail below with respect to FIGS. 6A-C.

Figure 2A:
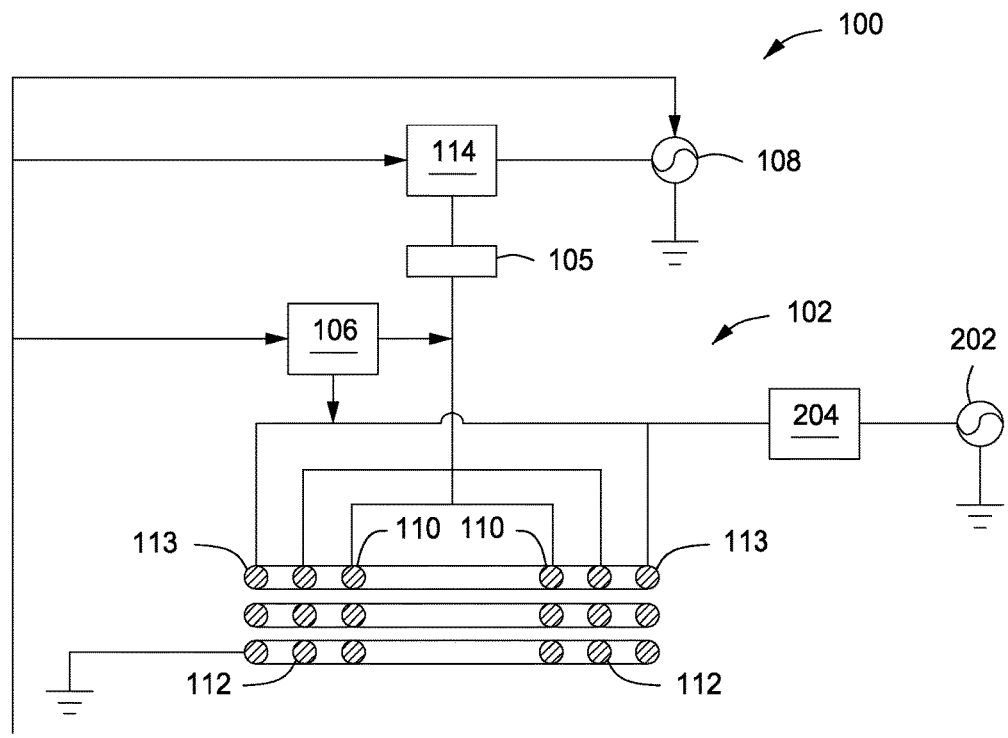
FIGS. 2A-B depict partial side views of an inductively coupled plasma reactor in accordance with some embodiments of the present invention.
Figure 2B:
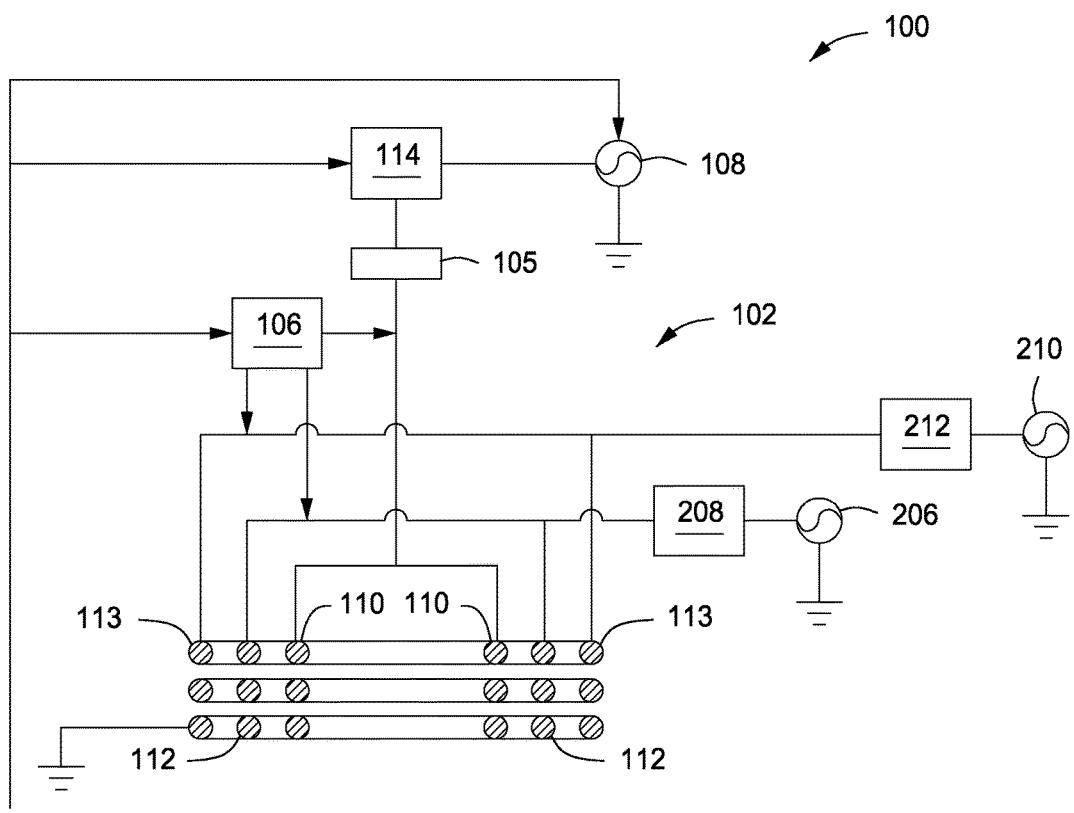

Alternatively, the inductively coupled plasma apparatus 102 may include two or more power sources as illustrated in FIGS. 2A-B. For example, FIG. 2A depicts a partial schematic view of the reactor 100 including the inductively coupled plasma apparatus 102 in accordance with some embodiments of the present invention. For example, as illustrated in FIG. 2A, the inductively coupled plasma source 102 may include two power sources for providing RF power to the first, second, and third RF coils 110, 112, 113. For example, the RF power source 108 (e.g., a first RF power source) may be coupled through the power divider 105 to the first and second RF coils 110, 112. A second RF power source 202 may be coupled to the third RF coil 113 to provide RF power thereto. For example, the second RF power source 202 may be coupled to the third RF coil 113 via a second match network 204. As illustrated in FIG. 2A, the match network 114 may be used to couple RF power from the RF power source 108 to the first and second RF coils 110, 112 via the power divider 105. For example, in operation, the power divider 105 may control a power ratio between the first and second RF coils 110, 112 and the second RF power source 202 may control the power provided to the third RF coil 113. For example, the first and second power sources 108, 202 may be linked, synchronized or the like to provide the desired overall power ratio between each of the first, second and third RF coils 110, 112, 113.

The design of the inductively coupled plasma apparatus 102 as illustrated in FIG. 2A is merely one exemplary embodiment. For example, such an embodiment may be advantageously used to adapt an existing dual coil inductively coupled plasma apparatus for use with a reactor capable of processing larger diameter substrates, for example, such as 450 mm substrates as discussed above. Accordingly, the second power source 202 and third RF coil 113 may be added to an existing dual coil inductively coupled reactor which may include the first and second RF coils 110, 112.

Alternatively, as illustrated in FIG. 2B, the inductively coupled plasma apparatus 102 may include three power sources, one coupled to each RF coil. For example, as illustrated in FIG. 2B, the RF power source 108 (e.g., a first RF power source) may be coupled to the first RF coil 110 via the match network 114. A second RF power source 206 may be coupled to the second RF coil 112 via a second match network 208. A third RF power source 210 may be coupled to the third RF coil 113 via a third match network 212. Similar to the above, the first, second and third power sources 108, 206, and 210 may be linked, synchronized, or the like to provide the desired overall power ratio between each of the first, second, and third RF coils 110, 112, 113. In some embodiments, and as illustrated in FIG. 2B, a power divider may not be utilized.

Returning to FIG. 1, the reactor 100 generally includes the process chamber 104 having a conductive body (wall) 130 and a dielectric lid 120 (that together define a processing volume), a substrate support pedestal 116 disposed within the processing volume, the inductively coupled plasma apparatus 102, and a controller 140. The wall 130 is typically coupled to an electrical ground 134. In some embodiments, the support pedestal 116 may provide a cathode coupled through a match network 124 to a biasing power source 122. The biasing source 122 may illustratively be a source of up to 1000 W at a frequency of approximately 400 kHz, 2 MHz, or 13.56 MHz that is capable of producing either continuous or pulsed power, although other frequencies and powers may be provided as desired for particular applications. In other embodiments, the source 122 may be a DC or pulsed DC source.

In some embodiments, a link (not shown) may be provided to couple the RF power source 108 (or a plurality of RF power sources as illustrated in FIGS. 2A-B) and the biasing source 122 to facilitate synchronizing the operation of one source to the other. Either RF source may be the lead, or master, RF generator, while the other generator follows, or is the slave. The link may further facilitate operating the RF power source 108 and the biasing source 122 in perfect synchronization, or in a desired offset, or phase difference. The phase control may be provided by circuitry disposed within either or both of the RF source or within the link between the RF sources. This phase control between the source and bias RF generators (e.g., 108, 122) may be provided and controlled independent of the phase control over the RF current flowing in the plurality of RF coils coupled to the RF power source 108. Further details regarding phase control between the source and bias RF generators may be found in commonly owned, U.S. patent application Ser. No. 12/465,319, filed May 13, 2009 by S. Banna, et al., and entitled, "METHOD AND APPARATUS FOR PULSED PLASMA PROCESSING USING A TIME RESOLVED TUNING SCHEME FOR RF POWER DELIVERY".

In some embodiments, the dielectric lid 120 may be substantially flat. Other modifications of the chamber 104 may have other types of lids such as, for example, a dome-shaped lid or other shapes. The dielectric lid 120 may also be referred to as a dielectric window through which the inductively coupled plasma apparatus 102 couples RF energy into the processing volume, for example, to form a plasma. The inductively coupled plasma apparatus 102 is typically disposed above the lid 120 and is configured to inductively couple RF power into the process chamber 104. The inductively coupled plasma apparatus 102 includes the first, second, and third RF coils 110, 112, 113 disposed above the dielectric lid 120. The relative position, ratio of diameters of each coil, and/or the number of turns in each coil can each be adjusted as desired to control, for example, the profile or density of the plasma being formed via controlling the inductance on each coil. Each of the first, second, and third RF coils 110, 112, 113 can be coupled through the match network 114 to the RF power source 108 as illustrated in FIG. 1, or through multiple match networks to multiple power sources as illustrated in FIGS. 2A-B. Any embodiments of a RF power source disclosed herein may illustratively be capable of producing up to 4000 W at a tunable frequency in a range from about 50 kHz to about 13.56 MHz, although other frequencies and powers may be provided as required for particular applications. In some embodiments, the frequency selected should be compatible with the ferrite shield material properties. For example, some ferrite shield material properties may require the RF frequency to be in a range of about 400 kHz to about 2 MHz.

The reactor 100 may be configured such that, when RF current flows through each of the RF coils (e.g., the first, second and third RF coils 110, 112, 113), either the RF current flows out-of-phase through at least one of the first, second, or third RF coils 110, 112, 113 with respect to at least another of the first, second, or third RF coils 110, 112, 113 or the phase of the RF current may be selectively controlled to be in-phase or out-of-phase in at least one of the first, second, or third RF coils 110, 112, 113 with respect to at least another of the first, second, or third RF coils 110, 112, 113. As used herein, the term "out-of-phase" can be understood to mean that the RF current flowing through one of the plurality of RF coils is flowing in an opposite direction to the RF current flowing through another of the plurality of RF coils, or that the phase of the RF current flowing through the first RF coil is shifted with respect to the RF current flowing through the second RF coil.

For example, the phase in the RF current may be shifted by one or more elements of the reactor 100, for example, such as by using a phase shifter and/or by winding RF coils in opposing directions such that RF current flows in opposite directions through the RF coils. As discussed herein, in embodiments where selective control of the RF current to be in-phase or out-of-phase in one or more of the RF coils is desired, at least a phase shifter may be included in the reactor 100, and optionally, one or more of the RF coils may be wound in opposing directions. Alternatively, when selective control of the RF current to be in-phase or out-of-phase is not desired, and only out-of-phase RF current through one or more of the RF coils is desired, a phase shifter may not be required. Accordingly, a phase shifter 106, as illustrated in FIGS. 1 and 2A-B is illustrated as an optional element using dotted lines.

For example, as illustrated in FIG. 1, a phase shifter, such as the phase shifter 106 or blocking capacitor (not shown) can be utilized to selectively shift the phase of the RF current flowing through one or more of the first, second, or third RF coils 110, 112, 113 such that the RF current flowing through at least one of the first, second, or third RF coil 110, 112, 113 is out-of-phase with the RF current flowing through another of the first, second, or third RF coils 110, 112, 113. In some embodiments, the phase shifter or blocking capacitor may shift the phase such that the RF current flowing through at least one of the first, second, or third RF coils 110, 112, 113 is about 180 degrees out of phase with the RF current flowing through another of the first, second, or third RF coils 110, 112, 113. However, the RF current need not be about 180 degrees out-of-phase, and in some embodiments, the phase may be up to about +/−180 degrees out-of-phase.

Similarly, embodiments of the inductively coupled plasma apparatus as illustrated in FIGS. 2A-B may utilize the phase shifter 106. For example, as illustrated in FIG. 2A, the phase shifter 106 may be coupled to both the first and second RF coils 110, 112 and the third RF coil 113. For example, the phase shifter 106 may be a single element coupled to each RF coil as illustrated in FIGS. 2A-B, or alternatively one or more elements (not shown), such as a separate element coupled to each RF coil. For example, as discussed above in the context of the embodiments of the inductively coupled plasma apparatus 102 illustrated in FIG. 2A, the third RF coil 113 may be added to an existing inductively coupled plasma apparatus. Accordingly, a separate phase shifter (not shown) may be coupled to third RF coil 113 for selectively shifting the phase of RF current through the third RF coil 113.

Figure 3A:
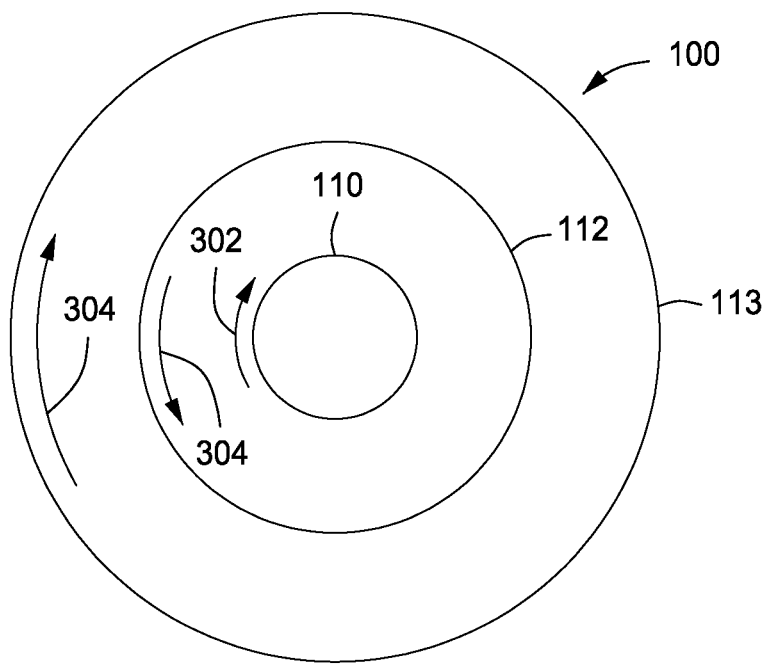
FIGS. 3A-B depict schematic top views of RF coils of an inductively coupled plasma reactor in accordance with some embodiments of the present invention.
Figure 3B:
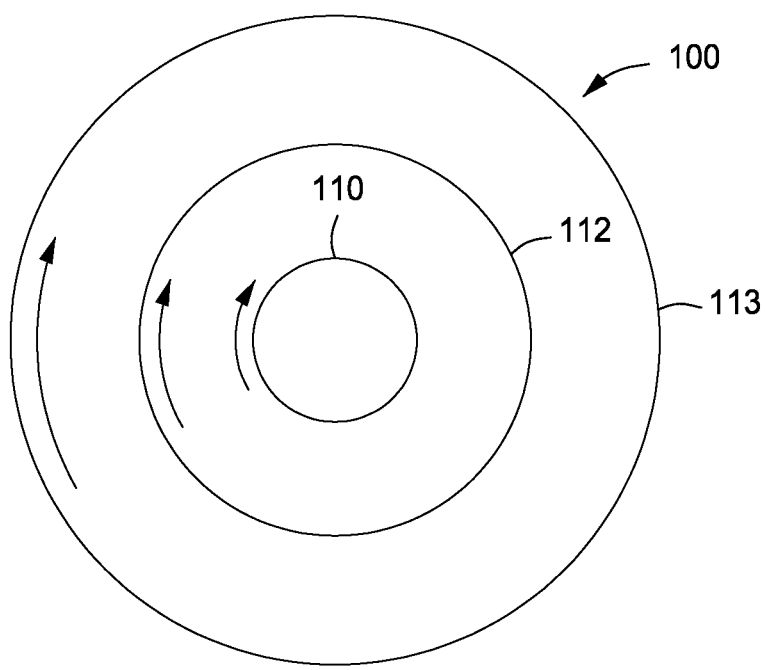

Alternatively to, or in combination with embodiments that include a phase shifter, one or more of the RF coils may be wound in opposing directions as illustrated in FIG. 3A-B. For example, in conventional apparatus, each RF coil is typically wound in the same direction. For example, in some embodiments, which include a phase shifter, the first, second and third RF coils 110, 112, 113 may be wound in the same direction as indicated by the arrows in FIG. 3B. As such, the RF current is flowing in the same direction in both coils, either clockwise (as shown) or counterclockwise. The same direction of the winding dictates that the RF current flowing in the two RF coils are always in phase, unless a phase shifter is included in the inductively coupled plasma apparatus. In the present invention, the inventors have examined providing RF current out-of-phase between the two coils by either external means (e.g., a phase shifter) or by physically winding at least one of the coils in the opposite direction, thus altering the original phase. By controlling the phase between the coils the inventors have discovered the ability to reduce and eliminate non-uniform etch results, such as the M-shape etch pattern, and furthermore to control the processing (such as etch rate) pattern from center high, to edge high or to a flat and uniform processing pattern. By providing out-of-phase RF current between the coils and by controlling the power ratio between the RF coils 110, 112, 113 the inventors have provided an apparatus that facilitates control over the processing pattern to achieve improved uniformity across the substrate.

By providing out-of-phase RF current between the coils, the apparatus reverses the destructive interference between the electromagnetic fields generated by each coil to be constructive, and, therefore, the typical constructive electric field plasma properties within the reactor may be similarly reversed. For example, the present apparatus may be configured to increase the electric field proximate each of the RF coils and decrease the electric field between the coils by providing out of phase RF current flowing along adjacent RF coils. In some embodiments, such as where the RF current in each of the coils is completely out-of-phase (e.g., reverse current flow or 180 phase difference) the electric fields may be maximized (or localized) proximate each of the RF coils and minimized (or null) between the coils due to destructive interference between opposing electric fields. The inventors have discovered that a plasma formed using such a coil configuration can advantageously have an improved, e.g., a more uniform, electric field distribution and that components of the plasma may diffuse into the null region of the electric field to provide a more uniform plasma.

In some embodiments, the direction of the RF current flowing through each coil can be controlled by the direction in which the coils are wound. For example, as illustrated in FIG. 3A, the first RF coil 110 can be wound in a first direction 302 and the second RF coil 112 can be wound in a second direction 304 which is opposite the first direction 302. Accordingly, although the phase of the RF signal provided by the RF power source 108 (for example, as illustrated in FIGS. 1, 2A) may be unaltered if a phase shifter 106 is not used, the opposing winding directions 302, 304 of the first and second RF coils 110, 112 cause the RF current to be out of phase, e.g., to flow in opposite directions. Similarly, the third RF coil 113 may be wound in the first direction 302 as illustrated in FIG. 3A. Accordingly, the third RF coil 113 may be in-phase with the first RF coil 110 and out-of-phase with the second RF coil 112. However, the embodiments of the RF coils illustrated in FIG. 3A is merely exemplary, and other embodiments are possible. For example, (not shown) adjacent RF coils may be wound in the same direction, such as the second and third RF coils 112, 113 wound in an opposing direction to the winding direction of the first RF coil 110 or other suitable winding combinations of the RF coils depending on the desired plasma characteristics.

Further, additional embodiments of the RF coils are possible, each RF coil need not be a singular continuous coil, and may each be a plurality (e.g., two or more) of interlineated and symmetrically arranged stacked coil elements. Further details regarding RF coils comprising interlineated and symmetrically arranged stacked coil elements may be found in commonly owned, U.S. patent application Ser. No. 12/821,609, filed Jun. 23, 2010 by V. Todorow, et al., and entitled, "INDUCTIVELY COUPLED PLASMA APPARATUS".

In some embodiments, a power divider, such as a dividing capacitor, may be provided to control the relative quantity of RF power provided by the RF power source 108 to the respective first, second, and third RF coils 110, 112, 113 as illustrated in FIG. 1; or by the RF power source 108 to the respective first and second RF coils 110, 112 as illustrated in FIG. 2A, where the magnitude of RF power provided to the third RF coil 113 may be controlled by the second RF power source 202. Alternatively, as illustrated in FIG. 2B, the magnitude of RF power may be independently controlled to each RF coil via separate RF power sources 108, 208, 210. For example, using any of the aforementioned embodiments illustrated in FIGS. 1, 2A-B, controlling the amount of RF power provided to each coil can facilitate control of plasma characteristics in zones corresponding to each of the RF coils 110, 112, 113.

Figure 4A:
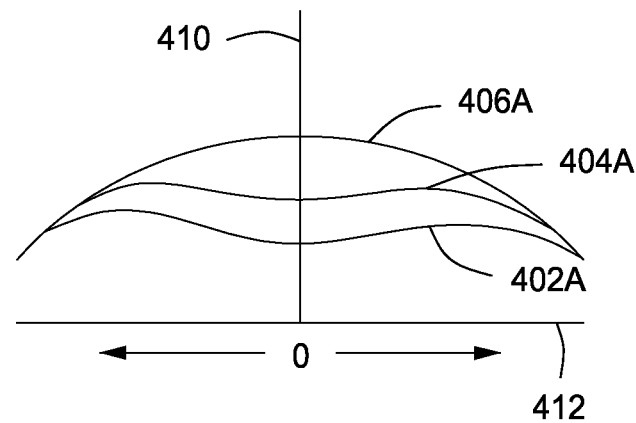
FIG. 4A illustratively depicts a graphs of etch rate profiles generated using conventional apparatus.
Figure 4B:
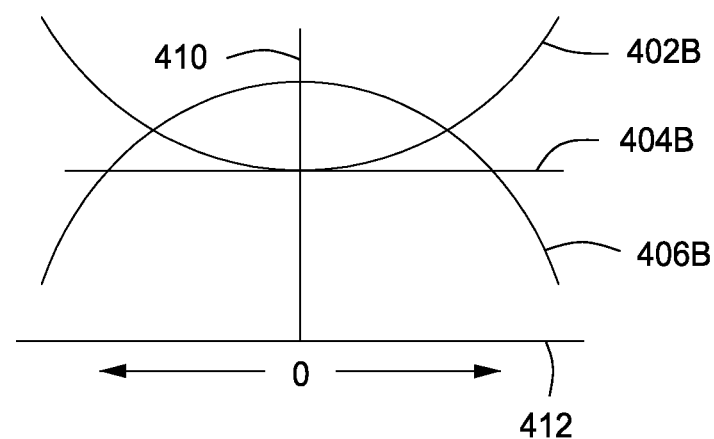
FIG. 4B illustratively depicts a graphs of etch rate profiles generated using an embodiment of the inventive apparatus as disclosed herein.

By adjusting the power ratio in combination with the phase of the RF signal flowing through each RF coil, the inventors have discovered that undesired processing non-uniformities (such as the M-shape etch profile of a substrate surface) may be controlled. For example, FIGS. 4A-B illustratively depict graphs of etch rate profiles generated using conventional apparatus and an embodiment of the inventive apparatus as disclosed herein. These graphs illustratively depict data from actual tests and observations performed by the inventors. FIG. 4A depicts an etch rate profile graph of the etch rate (axis 410) radially along a substrate surface (axis 412) for a plurality of power ratios between the first and second RF coils in a conventional apparatus (plots 402A, 404A and 406A). While some control over the etch rate profile can be achieved by adjusting the power ratio in the conventional apparatus, the inventors have discovered that any adjustment of the power ratio still results in inadequate overall uniformity, and in particular, poor edge profile tenability (e.g., each power ratio provides a limited effect at the edge of the etch profile).

In contrast, FIG. 4B depicts an etch rate profile graph of the etch rate (axis 410) radially along a substrate surface (axis 412) for a plurality of the same power ratios between each RF coil in an apparatus in accordance with embodiments of the present invention having the RF current flowing through at least one of the RF coils out-of-phase (plots 402B, 404B and 406B). Specifically, by making the same power ratio adjustments in the inventive apparatus as shown in FIG. 4B, the inventors have discovered that a significantly greater degree of uniformity control can be achieved. In addition, greatly improved edge profile tunability can be also achieved. As can be seen from the graph in FIG. 4B, the inventive apparatus can provide a substantially uniform etch rate profile by tuning the power ratio (e.g., 404B) and can also provide a significantly greater edge profile tunability as compared to a conventional apparatus. For example, by controlling the power ratio in a chamber configured to have RF current flowing through at least one of the RF coils out of phase, the uniformity profile can be controlled to provide center high and edge low etch rates, substantially flat etch rates, or center low and edge high etch rates. As these results are due to the plasma uniformity, such control is also transferrable to other processes or results (such as plasma treatment, deposition, annealing, or the like) where plasma uniformity provides control over such processes or results.

Returning to FIG. 1, a heater element 121 may be disposed atop the dielectric lid 120 to facilitate heating the interior of the process chamber 104. The heater element 121 may be disposed between the dielectric lid 120 and the first and second RF coils 110, 112. In some embodiments, the heater element 121 may include a resistive heating element and may be coupled to a power supply 123, such as an AC power supply, configured to provide sufficient energy to control the temperature of the heater element 121 to be between about 50 to about 100 degrees Celsius. In some embodiments, the heater element 121 may be an open break heater. In some embodiments, the heater element 121 may comprise a no break heater, such as an annular element, thereby facilitating uniform plasma formation within the process chamber 104.

During operation, a substrate 194 (such as a semiconductor wafer or other substrate suitable for plasma processing) may be placed on the pedestal 116 and process gases may be supplied from a gas panel 138 through entry ports 126 to form a gaseous mixture 150 within the process chamber 104. The gaseous mixture 150 may be ignited into a plasma 155 in the process chamber 104 by applying power from the power source 108 to the first and second RF coils 110, 112 and optionally, the one or more electrodes (not shown). In some embodiments, power from the bias source 122 may be also provided to the pedestal 116. The pressure within the interior of the chamber 104 may be controlled using a throttle valve 127 and a vacuum pump 136. The temperature of the chamber wall 130 may be controlled using liquid-containing conduits (not shown) that run through the wall 130.

The temperature of the substrate 194 may be controlled by stabilizing a temperature of the support pedestal 116. In one embodiment, helium gas from a gas source 148 may be provided via a gas conduit 149 to channels defined between the backside of the substrate 194 and grooves (not shown) disposed in the pedestal surface. The helium gas is used to facilitate heat transfer between the pedestal 116 and the substrate 194. During processing, the pedestal 116 may be heated by a resistive heater (not shown) within the pedestal to a steady state temperature and the helium gas may facilitate uniform heating of the substrate 194. Using such thermal control, the substrate 194 may illustratively be maintained at a temperature of between 0 and 500 degrees Celsius.

The controller 140 comprises a central processing unit (CPU) 144, a memory 142, and support circuits 146 for the CPU 144 and facilitates control of the components of the reactor 100 and, as such, of methods of forming a plasma, such as discussed herein. The controller 140 may be one of any form of general-purpose computer processor that can be used in an industrial setting for controlling various chambers and sub-processors. The memory, or computer-readable medium, 142 of the CPU 144 may be one or more of readily available memory such as random access memory (RAM), read only memory (ROM), floppy disk, hard disk, or any other form of digital storage, local or remote. The support circuits 446 are coupled to the CPU 144 for supporting the processor in a conventional manner. These circuits include cache, power supplies, clock circuits, input/output circuitry and subsystems, and the like. Inventive methods as described herein may be stored in the memory 142 as software routine that may be executed or invoked to control the operation of the reactor 100 in the manner described above. The software routine may also be stored and/or executed by a second CPU (not shown) that is remotely located from the hardware being controlled by the CPU 144.

Figure 5:
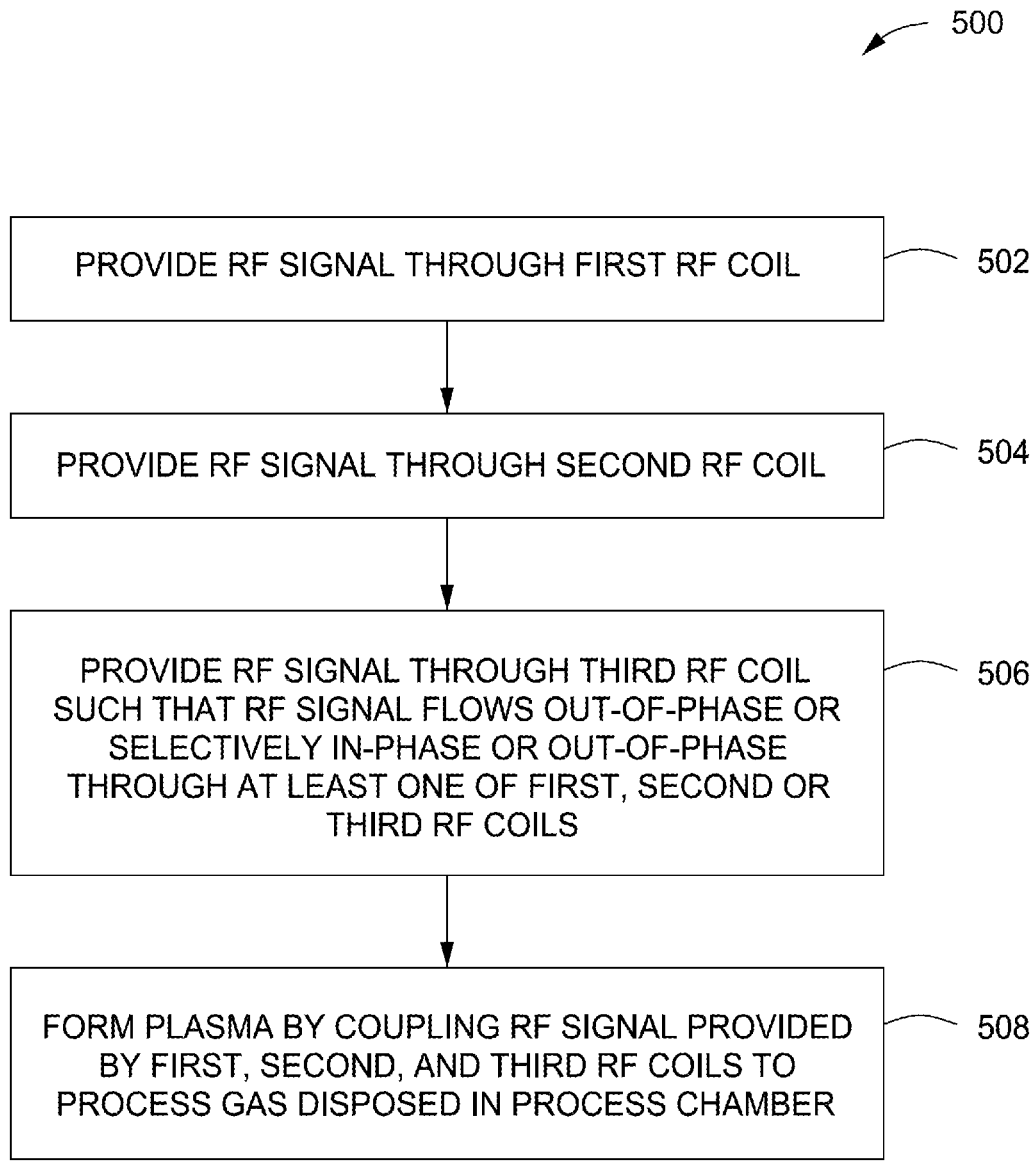
FIG. 5 depicts a flow chart for a method of plasma processing in a process chamber in accordance with some embodiments of the present invention.

FIG. 5 depicts a flow chart of a method 500 for plasma processing in accordance with some embodiments of the present invention. The method 500 is described below in accordance with embodiments of the invention illustrated in FIGS. 1-4. However, the method 500 can be applied with any embodiments of the invention described herein.

The method 500 begins at 502 by providing a first RF signal through a first RF coil, such as the first RF coil 110 (although the "first RF coil" of the method 500 may be either of the RF coils discussed above). The first RF signal may be provided at any suitable frequency desired for a particular application. Exemplary frequencies include but are not limited to, a frequency of between about 100 kHz to about 60 MHz. The RF signal may be provided at any suitable power, such as up to about 5000 Watts.

At 504, a second RF signal is provided through a second RF coil, e.g., the second RF coil 112, coaxially disposed with respect to the first RF coil. The second RF signal may be a separate RF signal provided to the second RF coil, for example, by the second RF power source 206, or alternatively, may be the same as the first RF signal provided by the first RF power source 108. The second RF signal may be provided through the second RF coil at any suitable phase desired for the particular application, such as in-phase or out-of-phase with the RF signals of the adjacent first or third RF coils 110, 113. As discussed above, the second RF signal may be provided such that is out-of-phase with RF signals in the adjacent first or third RF coils 100, 113, or alternatively, can be selected to be in-phase or out-of-phase with RF signals in the adjacent first or third RF coils 110, 113 as desired for a particular application. The second RF signal may be provided at any suitable frequency desired for a particular application. Exemplary frequencies include but are not limited to, a frequency of between about 100 kHz to about 60 MHz. The RF signal may be provided at any suitable power, such as up to about 5000 watts.

At 506, a third RF signal is provided through a third RF coil, e.g., the third RF coil 113, coaxially disposed with respect to the first and second RF coils 110, 112 such that at least one of the first, second or third RF signal flows out-of-phase with respect to at least another of the first, second or third RF signals, or the phase of at least one of the first, second or third RF signals with respect to at least another of the first, second or third RF signals can be selectively controlled to be in-phase or out-of-phase. The second RF signal may be provided at any suitable frequency desired for a particular application. Exemplary frequencies include but are not limited to, a frequency of between about 100 kHz to about 60 MHz. The RF signal may be provided at any suitable power, such as up to about 5000 watts.

Any of the above embodiments may be utilized to control the phase of the RF current flowing through the first, second or third RF coils 110, 112, 113. For example, as discussed above, to create an out-of-phase condition between any two RF coils, the RF coils can be wound in opposite directions. Alternatively or in combination, a phase shifter, such as phase shifter 106, can be utilized to shift the phase of the RF current flowing through one or more of the RF coils such that the RF current flowing through one RF coil is out of phase with the RF current flowing through another RF coil. In some embodiments, the phase shifter or blocking capacitor may shift the phase such that the RF current flowing through one RF coil is about 180 degrees out of phase with the RF current flowing through another RF coil. However, the RF current need not be about 180 degrees out of phase, and in some embodiments, the phase may be up to about +/−180 degrees out of phase. In some embodiments, the frequencies of each of the first, second and third RF signals may be about the same.

At 508, a plasma, such as the plasma 155, may be formed by coupling the first, second, and third RF signals provided by the first, second, and third RF coils to a process gas, such as the gaseous mixture 150, disposed in a process chamber. The process gas may include any suitable process gas for forming a plasma. In some embodiments, the RF signal may be provided at an equal power setting to each of the first, second, and third RF coils. In some embodiments, the RF signal may be provided at a fixed or an adjustable power ratio of about 1:10 to about 10:1 between any two of the first, second, and third RF coils 110, 112, 113, although other power ratios may be used for particular applications. For example, the magnitude of at least one of the first, second or third RF signals can be independently controlled. In some embodiments, for example, such as those illustrated in FIG. 2B, where each RF coil is coupled to a separate RF power source, the magnitude of each of the first, second, and third RF signals may be independently controlled. Similarly, in some embodiments, such as those illustrated in FIGS. 2A-2B, the frequencies of at least one of the first, second, or third RF signals may be independently controlled. The plasma may be maintained for a desired period of time using the same or different settings of the RF current ratio and/or the phase difference of the RF current flowing through the first, second and third RF coils.

Figure 6A:
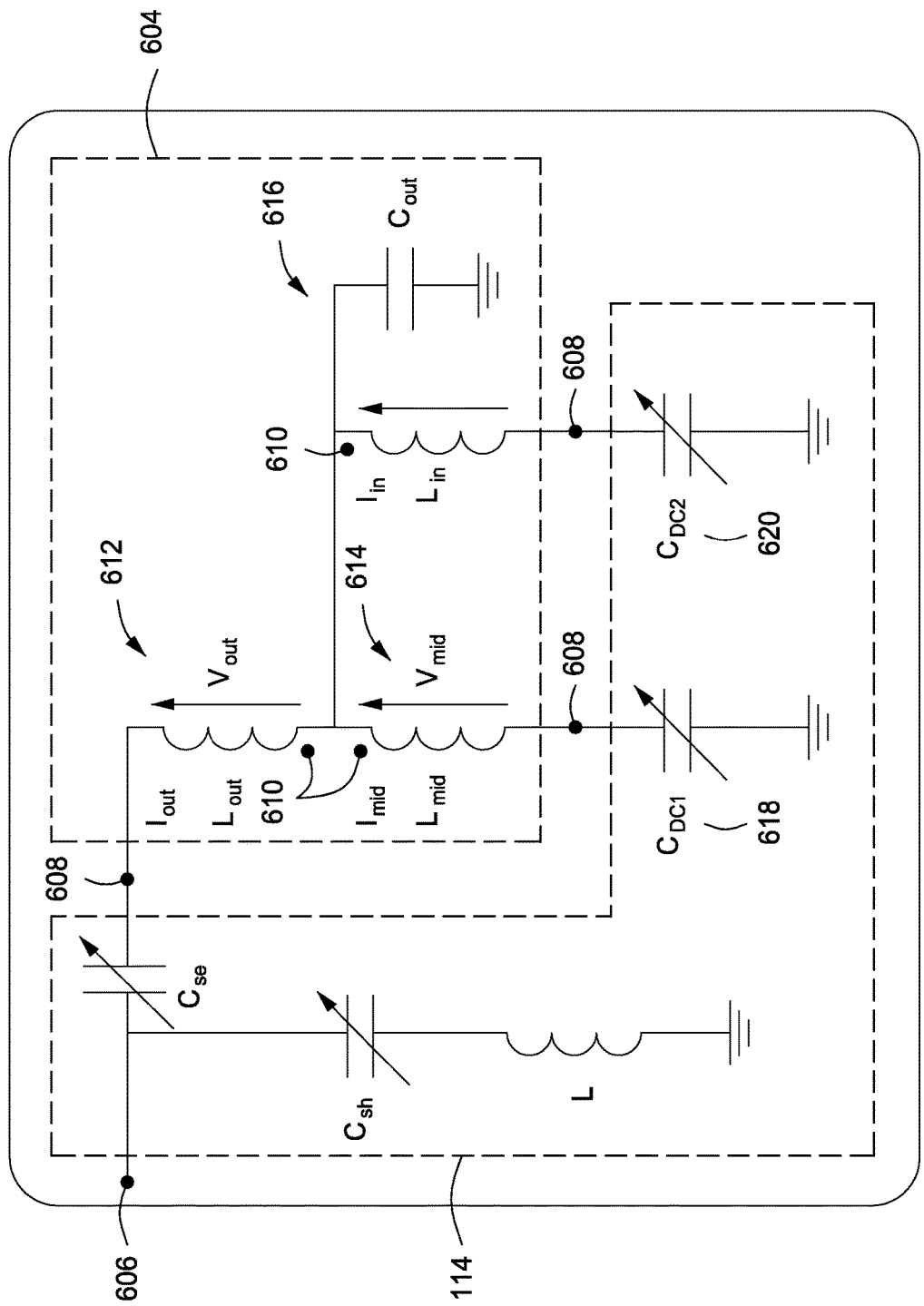
FIGS. 6A-C depict match network and coil circuits of an inductively coupled plasma reactor in accordance with some embodiments of the present invention.
Figure 6B:
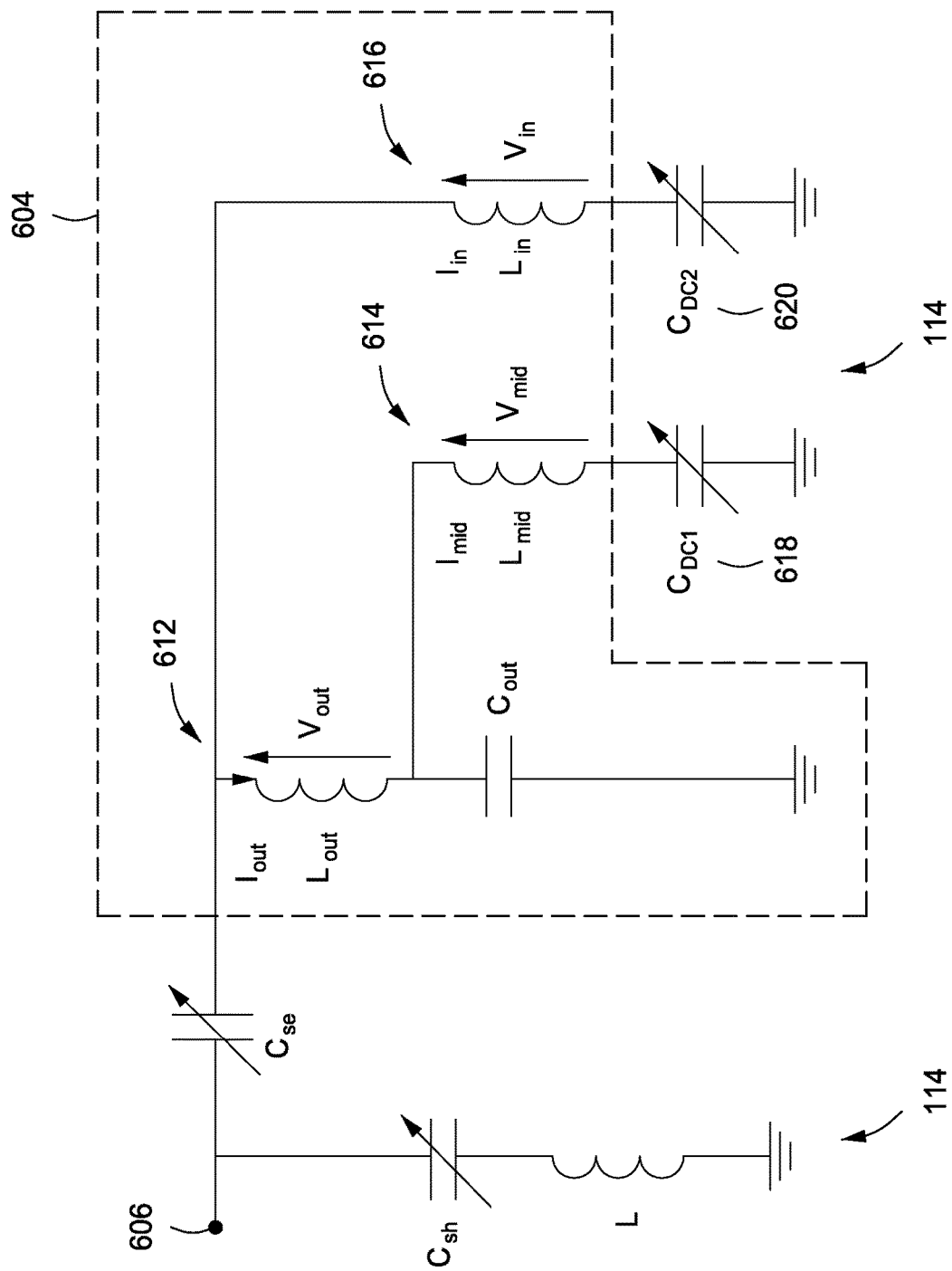
Figure 6C:
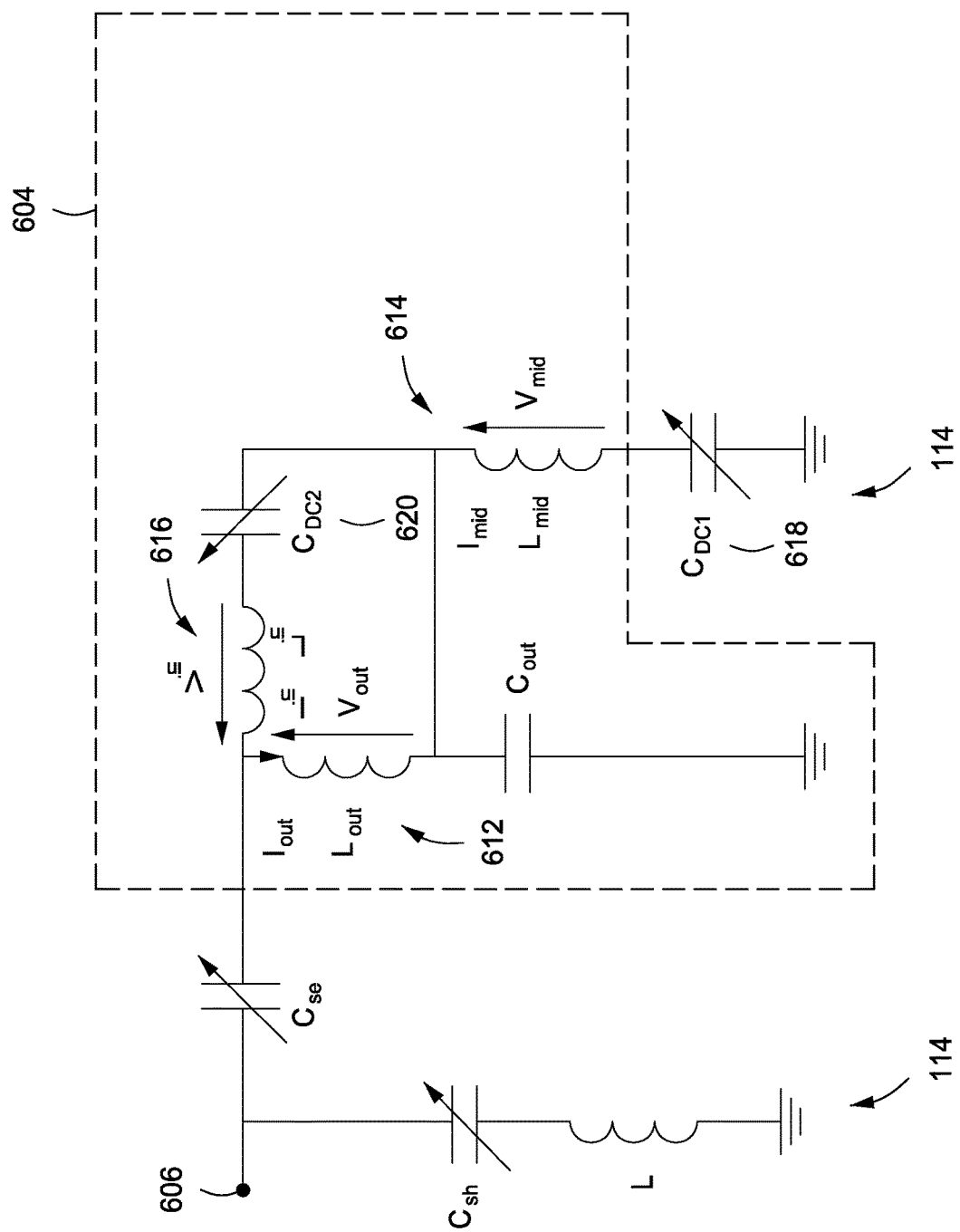

FIGS. 6A-C depict various circuit models of the plasma source that may be used to implement embodiments consistent with the present invention. The circuit models include the three coils discussed above that are represented by three simple coil circuits (e.g., outer coil 612, middle coil 614, and inner coil 616) and the remaining circuit is the match network 114 and power divider used to tune and control the RF power delivery. In some embodiments consistent with FIG. 6A, the match network 114 is shown coupled to the triple coil assembly 604 (i.e., coil circuits 612, 614 and 616). The match network 114 receives an RF match input 606. In some embodiments the RF match input 606 is a single input. In other embodiments, the RF match input 606 may be comprised of multiple inputs. The RF match outputs 608 from match network 114 are provided to triple coil assembly 604 as inputs. Elements 610 in FIG. 6A refer to the mutual inductance 610 of the three coils (outer coil 612, middle coil 614, and inner coil 616). The circuits shown in FIG. 6A-C do not include the impedance of the plasma load, and assumes lossless coils and capacitors. $C_{DC1}$ 618 and $C_{DC2}$ 620 are variable capacitors used to tune the power coupling between the different coils. In some embodiments, the variable capacitor values may be selected to determine the current ratio between the coils. In other embodiments, the desired current ratio may be selected and, the variable capacitor values will be calculated to achieve such current. FIGS. 6B and 6C provides different variations of a triple coil assembly circuit 604 that can be used with embodiments consistent with the present invention.

FIGS. 7A and 7B depict operation modes corresponding to the RF current phases between coils that are achievable based on values of the electrical components shown in FIGS. 6A-C. Specifically with respect to FIGS. 7A and 7B, changing the coils' currents phase (+ or −) as shown in FIG. 7A qualitatively changes the interference pattern of the electromagnetic fields, thereby changing the inductive power coupling profile of the coils as shown in the azimuthal electromagnetic field distributions in FIG. 7B. For example the current ratio at (a) in FIG. 7A is in the +/+ quadrant with an equal current ratio between all three coils (1:1:1). The azimuthal electromagnetic field distributions 702 for point (a) is shown FIG. 7B. In some embodiments, a user may simply select a mode (e.g., +/+, +/−, −/−, or −/+) and the desired current ratios within a pre-defined range. The mode chosen by the user is based on the desired plasma profile to control the peaks and valleys of the plasma profile created under the dielectric window.

Figure 8:
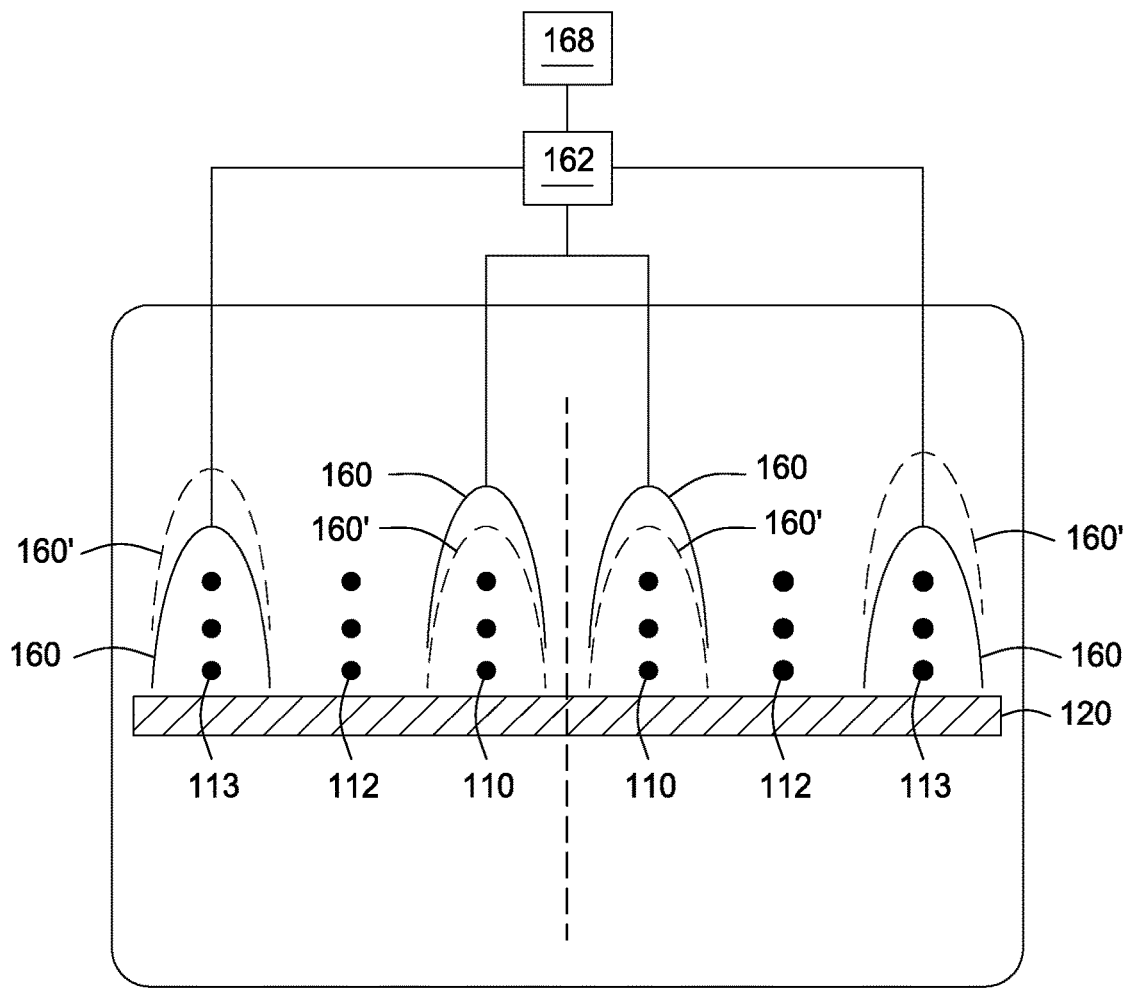
FIG. 8 depict partial side views of an inductively coupled plasma reactor with movable ferrite shields in accordance with some embodiments of the present invention.

FIG. 8 depicts first, second and third RF coils 110, 112 and 113 along with movable ferrite shields 160 (disposed above dielectric lid 120 of process chamber 104 as described above with respect to FIG. 1). Movable ferrite shields 160 may start in an initial position 160', and be moved to a new position 160 as desired to adjust the local magnetic field and smooth the M-shaped signature discussed above. As discussed above with respect to FIG. 1, in some embodiments, the ferrite shields 160 can be adjustable to move (e.g., up and down) and cover single or multiple turns of a given coil allowing flexibility in controlling EM field coupling between the coils. Switching RF current phase, along with ferrite shield 160 position optimization advantageously minimizes the M-shape signature of typical ICP reactors. The one or more ferrite shields 160 may be moved via ferrite shield actuator 162. The movement of the one or more ferrite shields 160 may be controlled by a controller 168 communicatively coupled to ferrite shield actuator 162.

Figure 9:
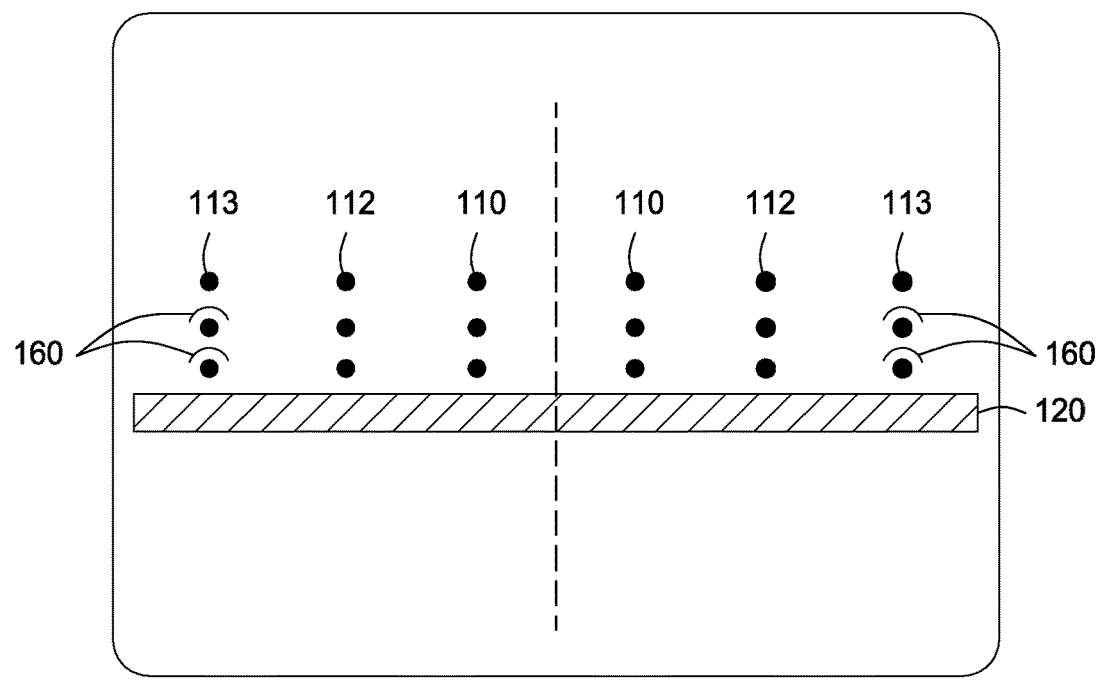
FIG. 9 depict partial side views of an inductively coupled plasma reactor with non-uniform ferrite shields in accordance with some embodiments of the present invention.

FIG. 9 depicts first, second, and third RF coils 110, 112, and 113 along with non-uniform ferrite shield 160 disposed proximate to at least some of the turns of at least one of the coils (disposed above dielectric lid 120 of process chamber 104 as described above with respect to FIG. 1). In some embodiments, the non-uniform ferrite shield 160 may be a fixed ferrite wire coupled to one or more turns of one or more of the first, second, and/or third RF coils 110, 112, and 113. In some embodiments, the upper part of each coil turn may be separately shielded. The Non-uniform ferrite shield 160 allows control of the local coupling efficiency and provides an additional control knob for uniformity control.

Figure 10:
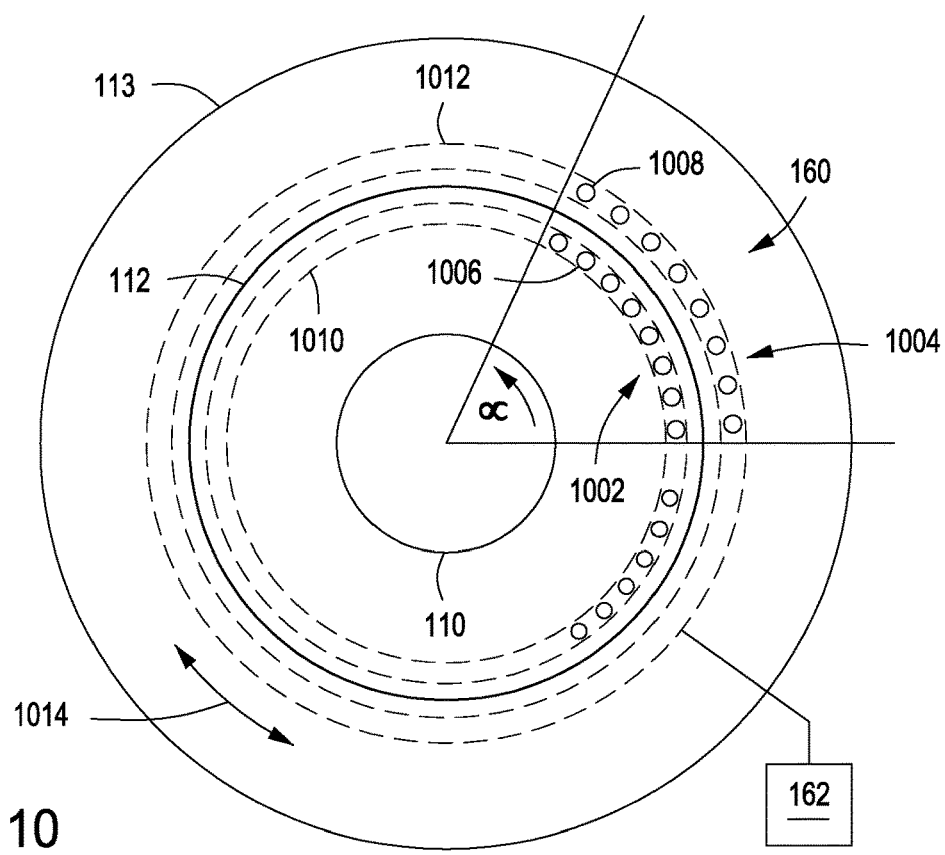
FIG. 10 depicts a schematic top view of a portion of an inductively coupled plasma reactor having ferrite shields in accordance with some embodiments of the present invention.

FIG. 10 depicts a schematic top view of a portion of an inductively coupled plasma reactor having ferrite shields in accordance with some embodiments of the present invention. Specifically, FIG. 10 depicts a top view of first, second, and third RF coils 110, 112, and 113 and ferrite shields 160 in accordance with some embodiments of the present invention. In embodiments consistent with FIG. 10, the ferrite shields 160 include a first plurality of vertical rods 1002 and a second plurality of vertical rods 1004 disposed on either side of a given RF coil (e.g., the second RF coil 112, as shown in FIG. 10). Although shown as only disposed on either side of second RF coil 112 in FIG. 10, the ferrite shield 160 may alternatively or in combination be disposed about any one or more of the other RF coils (e.g., 110, 113). Thus, the ferrite shield may be disposed about any one or more of the first, second, or third RF coils 110, 112, or 113. For example, a third plurality of vertical rods and a fourth plurality of vertical rods may be disposed on either side (e.g., the radially inner perimeter and radially outer perimeter) of a different RF coil (e.g., the first or third RF coil in FIG. 10). If all three RF coils have ferrite shields, a fifth and a sixth plurality of vertical rods may be disposed on either side of the remaining RF coil.

The vertical rods in the ferrite shield 160 may be configured to locally control the distribution of the plasma to compensate for process asymmetry, such as for skew control, plasma asymmetry, and/or plasma profile control. For example, the first plurality of vertical rods 1002 and the second plurality of vertical rods 1004 may be distributed about the entire perimeter of a given RF coil (as indicated by dashed lines 1010, 1012), or about a portion thereof (as indicated by angle alpha).

The vertical rods in each plurality of vertical rods can be held in place in any suitable manner that facilitates the proper placement and, if necessary, movement of the vertical rods. For example, the plurality of vertical rods can be directly or indirectly mounted to the lid of the process chamber. In some embodiments, a ring (or arc segment) may be provided to retain the plurality of vertical rods in place mounted to the ring. In some embodiments, a pair of rings (or arc segments) may be provided to retain the plurality of vertical rods in place mounted between the pair of rings (or arc segments). The rings or other support members may be fixed to the lid, may be movably mounted to the lid, or may be held in place above the lid. Other mounting and actuation configurations may also be used.

Individual rods 1006 of the first plurality of vertical rods 1002 and individual rods 1008 of the second plurality of vertical rods 1004 may be independently configured to locally control the impact of the vertical rod on the adjacent RF coil. For example, parameters that may be individually controlled for each vertical rod 1006, 1008 include a distance from the vertical rod to the adjacent RF coil, a distance between adjacent vertical rods within the given plurality of vertical rods, the diameter of the vertical rod, the magnetic permeability of the vertical rod, and the length of the vertical rod.

Exemplary values for the above parameters include, but are not limited to a distance from the vertical rod to the adjacent RF coil of about 0.1 to about 2 inches, a distance between adjacent rods of about 0.1 to about 3 inches, a diameter of the vertical rod from about 0.1 to about 1 inch, a magnetic permeability of about 10 to about 800, and a length of the vertical rod of up to about two inches longer or shorter than the height of the RF coil. In addition, any one or more of these parameters may be uniform throughout all vertical rods surrounding a given RF coil (e.g., within both 1002, 1004), uniform within a given plurality of vertical rods (e.g., within 1002 or within 10004), or non-uniform within either or both of the plurality of vertical rods surrounding the given RF coil (e.g., non-uniform within each of 1002 and 1004). For example, adjacent vertical rods in a plurality of vertical rods can be spaced evenly or unevenly from each other and may have the same or different magnetic permeability. Thus, by controlling the magnetic permeability and position of individual vertical rods as well as the geometric distribution of the individual rods with respect to each other and to the adjacent RF coil, the EM field lines formed within the process chamber during use can be controlled.

In addition, in some embodiments, the ferrite shield 160 may be coupled to the ferrite shield actuator 162 (discussed above) to control the vertical position of the ferrite shield with respect to the RF coils. In some embodiments, the ferrite shield actuator 162 is configured to rotate the ferrite shield 160 with respect to the process chamber, as indicated by arrows 1014. For example, individual pluralities of vertical rods (e.g., 1002, 1004) may be azimuthally asymmetric and may be rotated with respect to the process chamber as well as with respect to any other pluralities of vertical rods disposed adjacent other RF coils, for example, to control the orientation of the azimuthal asymmetry, to compensate for process non-uniformities.

Figure 11:
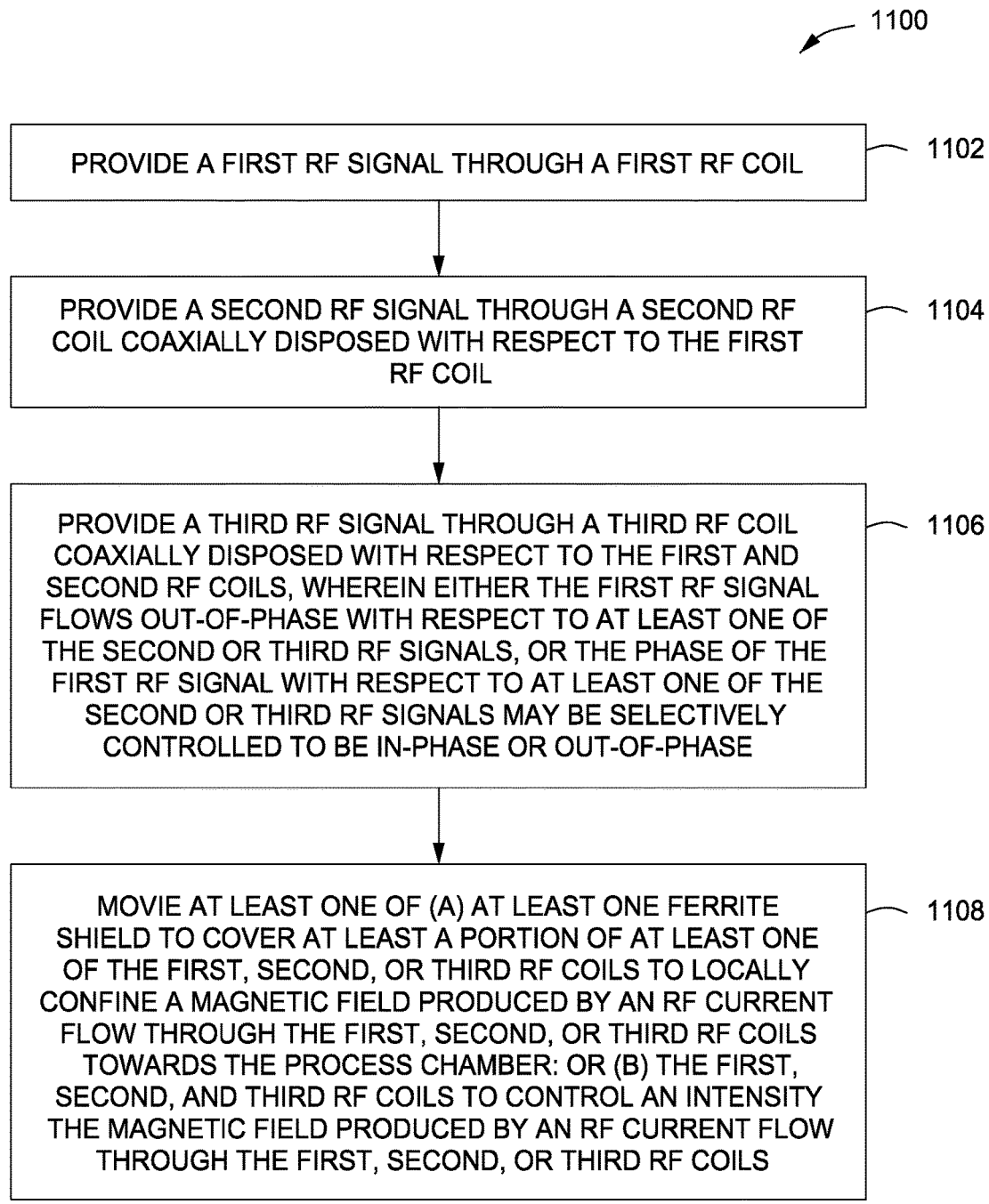
FIG. 11 depicts a flow chart for a method of plasma processing in a process chamber in accordance with some embodiments of the present invention.

FIG. 11 depicts a flow chart of a method for plasma processing in accordance with some embodiments of the present invention. The method 1100 is described below in accordance with embodiments of the invention illustrated in FIGS. 1-10. However, the method 1100 can be applied with any embodiments of the invention described herein.

The method 1100 begins at 1102 by providing a first RF signal through a first RF coil, such as the first RF coil 110 (although the "first RF coil" of the method 1100 may be either of the RF coils discussed above). The first RF signal may be provided at any suitable frequency desired for a particular application. Exemplary frequencies include but are not limited to, a frequency of between about 100 kHz to about 60 MHz. The RF signal may be provided at any suitable power, such as up to about 5000 watts.

At 1104, a second RF signal is provided through a second RF coil, e.g., the second RF coil 112, coaxially disposed with respect to the first RF coil. The second RF signal may be a separate RF signal provided to the second RF coil, for example, by the second RF power source 206, or alternatively, may be the same as the first RF signal provided by the first RF power source 108. The second RF signal may be provided through the second RF coil at any suitable phase desired for the particular application, such as in-phase or out-of-phase with the RF signals of the adjacent first or third RF coils 110, 113. As discussed above, the second RF signal may be provided such that is out-of-phase with RF signals in the adjacent first or third RF coils 100, 113, or alternatively, can be selected to be in-phase or out-of-phase with RF signals in the adjacent first or third RF coils 110, 113 as desired for a particular application. The second RF signal may be provided at any suitable frequency desired for a particular application. Exemplary frequencies include but are not limited to, a frequency of between about 100 kHz to about 60 MHz. The RF signal may be provided at any suitable power, such as up to about 5000 watts.

At 1106, a third RF signal is provided through a third RF coil, e.g., the third RF coil 113, coaxially disposed with respect to the first and second RF coils 110, 112 such that at least one of the first, second or third RF signal flows out-of-phase with respect to at least another of the first, second or third RF signals, or the phase of at least one of the first, second or third RF signals with respect to at least another of the first, second or third RF signals can be selectively controlled to be in-phase or out-of-phase. The second RF signal may be provided at any suitable frequency desired for a particular application. Exemplary frequencies include but are not limited to, a frequency of between about 100 kHz to about 60 MHz. The RF signal may be provided at any suitable power, such as up to about 5000 watts.

Any of the above embodiments may be utilized to control the phase of the RF current flowing through the first, second or third RF coils 110, 112, 113. For example, as discussed above, to create an out-of-phase condition between any two RF coils, the RF coils can be wound in opposite directions. Alternatively or in combination, a phase shifter, such as phase shifter 106, can be utilized to shift the phase of the RF current flowing through one or more of the RF coils such that the RF current flowing through one RF coil is out of phase with the RF current flowing through another RF coil. In some embodiments, the phase shifter or blocking capacitor may shift the phase such that the RF current flowing through one RF coil is about 180 degrees out of phase with the RF current flowing through another RF coil. However, the RF current need not be about 180 degrees out of phase, and in some embodiments, the phase may be up to about +/−180 degrees out of phase. In some embodiments, the frequencies of each of the first, second and third RF signals may be about the same.

At 1108, at least one ferrite shield may be provided to cover at least a portion of at least one of the first, second, or third RF coils to locally confine a magnetic field produced by an RF current flow through the first, second or third RF coils toward the process chamber and/or the first, second, and third RF coils may be moved to control an intensity of the magnetic field produced by an RF current flow through the first, second or third RF coils. The at least one ferrite shield may be any of the ferrite shields described above. The ferrite shields may be provided in a fixed location, or at least one of the ferrite shields may be moved relative to the RF coils as discussed above. For example, at least one of the ferrite shields may be moved horizontally to control the amount of shielding provided to the adjacent RF coil corresponding to the ferrite shield being moved. Alternatively or in combination, at least one of the ferrite shields may be moved laterally, tilted on an axis, and/or rotated to further control the amount of shielding provided to the adjacent RF coil corresponding to the ferrite shield being moved. Such control over the amount of shielding advantageously facilitates greater control of the electromagnetic field line distribution in the process chamber, thereby enabling compensation for non-uniformities in the process chamber that would otherwise yield non-uniform processing results.

Thus, methods and apparatus for plasma processing are provided herein. The inventive methods and plasma processing apparatus advantageously reduces additive electric field properties between adjacent plasma coils in multi-coil plasma apparatus. Accordingly, a plasma formed utilizing the inventive plasma apparatus has an improved electric field distribution, and can be utilized to produce a smoother etch surface.

While the foregoing is directed to embodiments of the present invention, other and further embodiments of the invention may be devised without departing from the basic scope thereof.

The invention claimed is:

1. A plasma processing apparatus, comprising:
a process chamber having an interior processing volume;
a first RF coil disposed proximate to the process chamber to couple RF energy into the processing volume;
a second RF coil disposed proximate to the process chamber to couple RF energy into the processing volume, the second RF coil disposed coaxially with respect to the first RF coil;
a third RF coil disposed proximate to the process chamber to couple RF energy into the processing volume, the third RF coil disposed coaxially with respect to the first and second RF coils;
wherein at least one of the first, second and third RF coils is coupled to a coil actuator;
at least one magnetic field confinement shield coupled to a shield actuator and disposed between at least two of the first, second, or third RF coils, wherein the at least one magnetic field confinement shield covers one or more turns of the first, second, or third RF coil from at least one or more turns of another RF coil and is adjustable such that a coil-to-coil magnetic field produced when an RF current flows through the first, second, or third RF coils is adjustable and partially confined from at least one other of the first, second, or third RF coils;
a controller communicatively coupled to the coil actuator and the shield actuator such that coil-to-coil magnetic field coupling and coil-to-plasma magnetic field coupling is adjustable; and
wherein the plasma processing apparatus is configured such that, when RF current flows through the each of the RF coils, either the RF current flows out-of-phase through at least one of the first, second, or third RF coils with respect to at least another of the first, second, or third RF coils when the first RF coil is wound in a first direction and at least one of the second or third RF coils is wound in a second direction opposite the first direction or a phase of the RF current may be selectively controlled to be in-phase or out-of-phase in at least one of the first, second, or third RF coils with respect to at least another of the first, second, or third RF coils using a phase shifter coupled to at least one of the first, second, or third RF coils.

2. The plasma processing apparatus of claim 1, wherein the at least one magnetic field confinement shield can be moved vertically to cover at least a portion of at least one of the first, second, or third RF coils.

3. The plasma processing apparatus of claim 1, wherein the at least one magnetic field confinement shield is azimuthally asymmetric and can be moved rotationally to vary an orientation of the azimuthal asymmetry.

4. The plasma processing apparatus of claim 1, wherein the at least one magnetic field confinement shield includes a separate magnetic field confinement shield for each one of the first, second, or third RF coils, and wherein each of the separate magnetic field confinement shields is independently movable and controllable.

5. The plasma processing apparatus of claim 1, wherein the at least one magnetic field confinement shield only includes a first magnetic field confinement shield for the first RF coil and a second magnetic field confinement shield for the third RF coil, wherein each of the first and second magnetic field confinement shields is independently movable and controllable.

6. The plasma processing apparatus of claim 1, wherein the at least one magnetic field confinement shield is a fixed ferrite wire coupled to a least a portion of at least one of the first, second or third RF coils.

7. The plasma processing apparatus of claim 1, wherein the first, second, and third RF coils are movable in vertical and horizontal directions.

8. The plasma processing apparatus of claim 1, wherein the at least one magnetic field confinement shield comprises a first plurality of vertical rods disposed adjacent to a given RF coil of the first, second, and third RF coils on a first side of the given RF coil and a second plurality of vertical rods disposed adjacent to the given RF coil on a second side of the given RF coil opposite the first side.

9. The plasma processing apparatus of claim 8, wherein the first and second pluralities of vertical rods are arranged along an entire perimeter of the given RF coil.

10. The plasma processing apparatus of claim 8, wherein the first and second pluralities of vertical rods are arranged along less than an entire perimeter of the given RF coil.

11. The plasma processing apparatus of claim 8, wherein the first and second pluralities of vertical rods include at least a first individual vertical rod that is different than at least a second individual vertical rod in at least one of diameter, distance with respect to an adjacent vertical rod, distance with respect to the given RF coil, or magnetic permeability.

12. The plasma processing apparatus of claim 1, wherein the first, second, and third RF coils are configured to rotate about a horizontal axis such that a first portion of the first, second, and third RF coils is disposed closer to the process chamber, and a second portion of the first, second, and third RF coil is disposed further from the process chamber.

13. The plasma processing apparatus of claim 1, wherein the at least one magnetic field confinement shield is configured to move and cover at least a portion of at least one of the first, second or third RF coils to locally confine a magnetic field produced by an RF current flow through the first, second or third RF coils toward the process chamber.

14. The plasma processing apparatus of claim 1, wherein the first, second, and third RF coils are configured to move in at least one of a vertical, horizontal, or rotational direction to control an intensity the magnetic field produced by an RF current flow through the first, second, or third RF coils.

* * * * *